United States Patent
Shibazaki

(10) Patent No.: US 8,609,301 B2
(45) Date of Patent: Dec. 17, 2013

(54) MASK, EXPOSURE APPARATUS AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/399,483

(22) Filed: Mar. 6, 2009

(65) Prior Publication Data

US 2009/0170014 A1 Jul. 2, 2009

Related U.S. Application Data

(63) Continuation of application No. PCT/JP2007/067512, filed on Sep. 7, 2007.

(30) Foreign Application Priority Data

Sep. 8, 2006 (JP) ................ P2006-244269

(51) Int. Cl.
- *G03F 1/00* (2012.01)
- *G03F 9/00* (2006.01)
- *G03B 27/46* (2006.01)
- *H01L 21/00* (2006.01)

(52) U.S. Cl.
USPC ............... 430/5; 430/22; 430/311; 355/47; 355/48; 355/50

(58) Field of Classification Search
USPC .............. 430/5, 22; 355/50, 47–49
See application file for complete search history.

(56) References Cited

U.S. PATENT DOCUMENTS

| | | | | |
|---|---|---|---|---|
| 4,176,926 A | * | 12/1979 | Eadie et al. | 396/548 |
| 4,935,774 A | * | 6/1990 | Ageishi et al. | 355/104 |
| 4,999,511 A | * | 3/1991 | Kohno | 250/559.11 |
| 5,106,455 A | | 4/1992 | Jacobsen et al. | |
| 5,250,983 A | * | 10/1993 | Yamamura | 355/125 |
| 5,493,403 A | | 2/1996 | Nishi | |
| 5,751,085 A | | 5/1998 | Hayashi | |

(Continued)

FOREIGN PATENT DOCUMENTS

| | | |
|---|---|---|
| EP | 1037266 A1 | 9/2000 |
| JP | 53-119679 | 10/1978 |

(Continued)

OTHER PUBLICATIONS

Notice of Reasons for Rejection issued Sep. 13, 2011 in Japanese Application No. 2008-533214.

(Continued)

*Primary Examiner* — Jonathan Jelsma
(74) *Attorney, Agent, or Firm* — Miles & Stockbridge, P.C.

(57) ABSTRACT

A circular cylinder-shaped mask is used to form an image of a pattern on a substrate via a projection optical system. The mask has a pattern formation surface on which the pattern is formed and that is placed around a predetermined axis, and the mask is able to rotate, with the predetermined axis taken as an axis of rotation, in synchronization with a movement of the substrate in at least a predetermined one-dimensional direction. When a diameter of the mask on the pattern formation surface is taken as D, and a maximum length of the substrate in the one-dimensional direction is taken as L, and a projection ratio of the projection optical system is taken as β, and circumference ratio is taken as π, then the conditions for D≥(β×L)/π are satisfied.

30 Claims, 18 Drawing Sheets

(56) References Cited

U.S. PATENT DOCUMENTS

| | | | |
|---|---|---|---|
| 5,825,043 A | 10/1998 | Suwa | |
| 5,905,007 A * | 5/1999 | Ho et al. | 430/22 |
| 5,969,441 A | 10/1999 | Loopstra et al. | |
| 6,327,025 B1 | 12/2001 | Imai | |
| 6,341,007 B1 | 1/2002 | Nishi et al. | |
| 6,400,441 B1 | 6/2002 | Nishi et al. | |
| 6,411,362 B2 * | 6/2002 | Anderson et al. | 355/50 |
| 6,549,269 B1 | 4/2003 | Nishi et al. | |
| 6,576,406 B1 * | 6/2003 | Jacobsen et al. | 430/322 |
| 6,590,634 B1 | 7/2003 | Nishi et al. | |
| 6,611,316 B2 | 8/2003 | Sewell | |
| 6,653,024 B1 * | 11/2003 | Shiraishi et al. | 430/5 |
| 6,707,536 B2 * | 3/2004 | Nishi | 355/53 |
| 6,897,963 B1 | 5/2005 | Taniguchi et al. | |
| 6,992,752 B2 * | 1/2006 | De Jongh | 355/53 |
| 2002/0041377 A1 | 4/2002 | Hagiwara et al. | |
| 2003/0169409 A1* | 9/2003 | Nishi | 355/51 |
| 2006/0175993 A1* | 8/2006 | Shibata et al. | 318/135 |
| 2007/0202442 A1* | 8/2007 | Zwadlo | 430/302 |
| 2008/0032066 A1* | 2/2008 | Stiblert et al. | 427/595 |
| 2009/0170014 A1 | 7/2009 | Shibazaki | |

FOREIGN PATENT DOCUMENTS

| | | |
|---|---|---|
| JP | 61-44429 A | 3/1986 |
| JP | 04-065603 A | 3/1992 |
| JP | 05-067551 | 3/1993 |
| JP | 06-124873 A | 5/1994 |
| JP | 06-134586 A | 5/1994 |
| JP | 07-153672 A | 6/1995 |
| JP | 08-033268 A | 2/1996 |
| JP | 08-037149 A | 2/1996 |
| JP | 08-213305 A | 8/1996 |
| JP | A-10-086323 | 4/1998 |
| JP | 10-163099 A | 6/1998 |
| JP | 10-214783 A | 8/1998 |
| JP | 10-303114 A | 11/1998 |
| JP | 11-045846 A | 2/1999 |
| JP | 11-135400 A | 5/1999 |
| JP | A-11-154645 | 6/1999 |
| JP | 2000-505958 A | 5/2000 |
| JP | 2000-164504 A | 6/2000 |
| JP | 2002-14005 A | 1/2002 |
| JP | 2004-519850 A | 7/2004 |
| JP | 2004-228149 A | 8/2004 |
| JP | 2004-333894 A | 11/2004 |
| JP | 2005-211839 A | 8/2005 |
| JP | 2006-93318 A | 4/2006 |
| JP | 2006-187135 A | 7/2006 |
| JP | 2007-227438 A | 9/2007 |
| KR | 10-2001-0015698 A | 2/2001 |
| WO | WO 99/18604 | 4/1999 |
| WO | WO 99/23692 A1 | 5/1999 |
| WO | WO 99/49504 A1 | 9/1999 |
| WO | WO 2004/019128 A2 | 3/2004 |
| WO | WO 2005/059617 A2 | 6/2005 |
| WO | WO 2005/059618 A2 | 6/2005 |
| WO | WO 2008/029917 A1 | 3/2008 |

OTHER PUBLICATIONS

Office Action issued Jun. 27, 2012, in Taiwan Patent Application No. 096133393 (with Translation of the Preliminary Examination Report).

Office Action (Notice of Reasons for Rejection) issued Jun. 4, 2013, in Japanese Patent Application No. 2011-248698.

Office Action issued Jul. 23, 2013, in Korean Patent Application No. 10-2008-7023087.

* cited by examiner

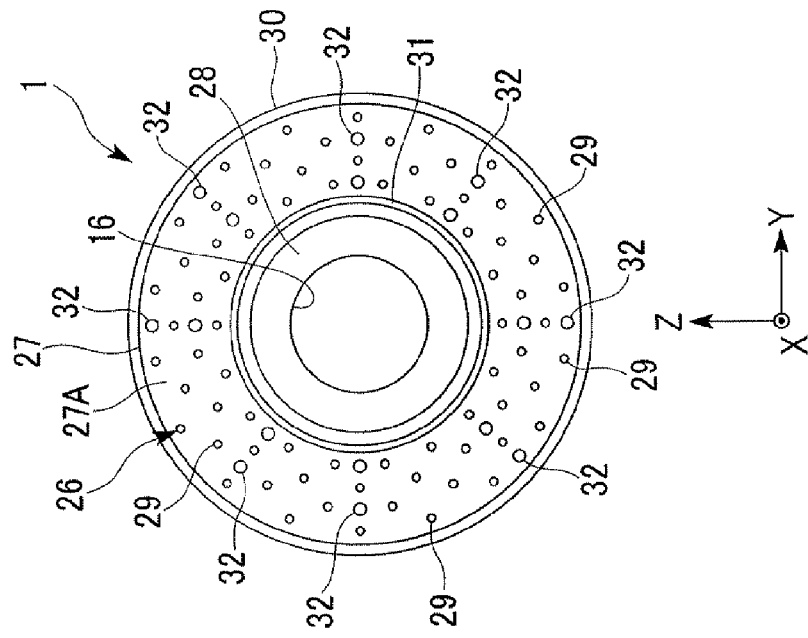
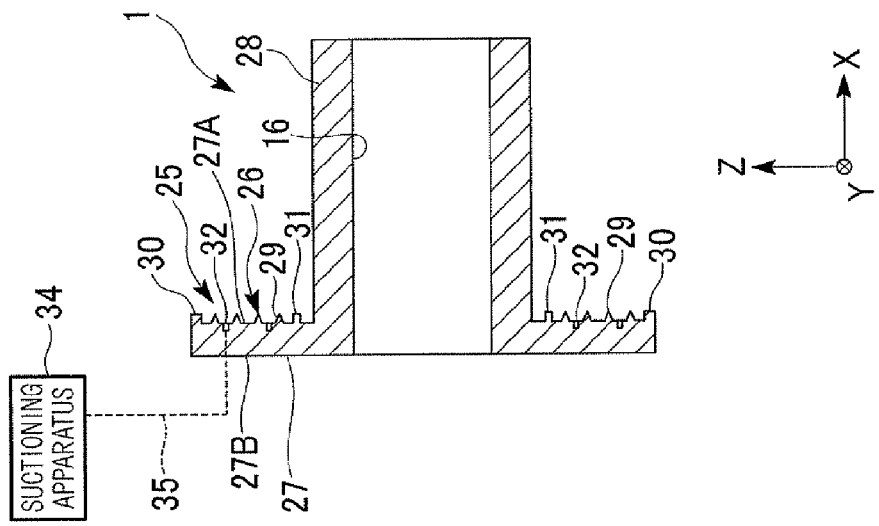

MASK, EXPOSURE APPARATUS AND DEVICE MANUFACTURING METHOD

CROSS-REFERENCE TO RELATED APPLICATION

This is a Continuation Application of International Application No. PCT/JP2007/067512, filed Sep. 7, 2007, which claims priority to Japanese Patent Application No. 2006-244269 filed on Sep. 8, 2006. The contents of the aforementioned applications are incorporated herein by reference.

BACKGROUND

1. Field of the Invention

The present invention relates to a mask, an exposure apparatus that exposes a substrate, and a device manufacturing method.

2. Description of Related Art

Among exposure apparatuses that are used in photolithographic processing, as is described in the patent documents such as Japanese Patent Application Publication Nos. H07-153672 A, H08-213305 A, and 2006-093318 A, an exposure apparatus is known that exposes a substrate using a circular cylinder-shaped or circular column-shaped mask.

It is necessary to precisely adjust the positional relationship between the mask and the substrate not only when a plate-shaped mask is used, but also when a substrate is exposed using a circular cylinder-shaped or circular column-shaped mask. If the positional relationship between the mask and the substrate cannot be precisely adjusted, or if there is a change in the positional relationship between the mask and the substrate because of vibration or the like, there is a strong possibility that it will not be possible to properly expose the substrate using an image of the pattern on the mask.

Moreover, when, for example, a substrate is exposed while it being moved in synchronization with the movement of a mask, in order to properly expose the substrate, after the acceleration of the mask and/or substrate has ended, it is necessary in some cases to provide a wait time (i.e., a static time) for any generated vibration to settle down and for the speed to become constant. In cases such as these, if there are frequent changes in the movement direction of the mask and/or the movement direction of the substrate, then the acceleration action increases by the same extent, so that it becomes necessary for an extended static time to be provided. In this case, the time that cannot be used for exposure becomes even longer so that there is a possibility that throughput will be reduced. In order to limit any deterioration in throughput, it is desirable for the number changes in the movement directions of the mask and/or substrate to be kept as few as possible, and for any vibration that occurs to be allowed to rapidly settle.

A purpose of some aspects of the present invention is to provide a mask that makes it possible to suppress any decrease in throughout and to form a superior image of a pattern on a substrate. Another purpose is to provide an exposure apparatus and a device manufacturing method that make it possible to suppress any decrease in throughput and to properly expose a substrate using an image of a pattern.

SUMMARY

A first aspect of the present invention is a mask which is used to form an image of a pattern on a substrate via a projection optical system, and includes: a pattern formation surface on which the pattern is formed and that is placed around a predetermined axis; and a circular cylinder-shaped body which has the pattern formation surface, and which is able to rotate, with the predetermined axis taken as an axis of rotation, in synchronization with a movement of the substrate in at least a predetermined one-dimensional direction, wherein when a diameter of the mask on the pattern formation surface is taken as D), and a maximum length of the substrate in the one-dimensional direction is taken as L, and a projection ratio of the projection optical system is taken as $\beta$, and circumference ratio is taken as $\pi$, then the conditions for $D \geq (\beta \times L)/\pi$ are satisfied.

According to the first aspect of the present invention, it is possible to suppress any deterioration in throughput and form a superior image of a pattern on a substrate.

A second aspect of the present invention is a mask which is used to form an image of a pattern on a substrate via a projection optical system, and includes: a pattern formation surface on which the pattern is formed and that is placed around a predetermined axis; and a circular cylinder-shaped body which has the pattern formation surface, and which is able to rotate, with the predetermined axis taken as an axis of rotation, in synchronization with a movement of the substrate in at least a predetermined one-dimensional direction, wherein when a diameter of the mask on the pattern formation surface is taken as D, and a maximum length of the substrate in the one-dimensional direction is taken as L, and a projection ratio of the projection optical system taken as $\beta$, and circumference ratio is taken as $\pi$, then the conditions for $(\beta \times L)/\pi \geq D \geq (\beta \times L)/(2 \times \pi)$ are satisfied.

According to the second aspect of the present invention, it is possible to suppress any deterioration in throughput and form a superior image of a pattern on a substrate.

A third aspect of the present invention is an exposure apparatus which, using the above described mask, exposes a substrate with an image of a pattern formed on the mask, and includes: a mask driving apparatus which is able to rotate the mask with the predetermined axis taken as an axis of rotation; a substrate driving apparatus which is able to move the substrate in at least a predetermined one-dimensional direction in synchronization with the rotation of the mask; and a projection optical system that projects the image of the pattern on the mask onto the substrate.

According to the third aspect of the present invention, it is possible to suppress any deterioration in throughput and form a superior image of a pattern on a substrate.

A fourth aspect of the present invention is an exposure apparatus which exposes a substrate with an image of a pattern, and includes: a holding member which removably holds a side surface of a circular cylinder-shaped mask which has a pattern formation surface on which a pattern has been formed and which is placed around the predetermined axis.

According to the fourth aspect of the present invention, it is possible to suppress any deterioration in throughput and form a superior image of a pattern on a substrate.

A fifth aspect of the present invention is an exposure apparatus which exposes a substrate with an image of a pattern, and includes: a holding member which holds a circular cylinder-shaped mask which has a pattern formation surface on which the pattern is formed and which is placed around a predetermined axis; and a mask driving apparatus which is able to move the holding member which is holding the mask in directions of six degrees of freedom.

According to the fifth aspect of the present invention, it is possible to suppress any deterioration in throughput and form a superior image of a pattern on a substrate.

A sixth aspect of the present invention is an exposure apparatus which exposes a substrate with an image of a pattern, and includes: a mask driving apparatus which is able to rotate a circular cylinder-shaped mask which has a pattern formation surface on which the pattern is formed and which is placed around the predetermined axis; and a countermass which absorbs reaction force created by a rotation of the mask.

According to the sixth aspect of the present invention, it is possible to suppress any deterioration in throughput and form a superior image of a pattern on a substrate.

A seventh aspect of the present invention is an exposure apparatus which exposes a substrate with an image of a pattern, and includes: a holding member which holds a circular cylinder-shaped mask which has a pattern formation surface on which the pattern is formed and which is placed around the predetermined axis; a shaft member which rotatably supports the holding member with the predetermined axis taken as the axis of rotation, and which has the holding member placed at one end side thereof, a support member which rotatably supports the shaft member; and a weight member which is placed at the other end side of the shaft member, and which has the support member placed between itself and the holding member.

According to the seventh aspect of the present invention, it is possible to suppress any deterioration in throughput and form a superior image of a pattern on a substrate.

An eighth aspect of the present invention is a device manufacturing method which uses the exposure apparatus according to the above described aspects.

According to the eighth aspect of the present invention, it is possible to manufacture a device using an exposure apparatus which makes it possible to suppress any deterioration in throughput and form a superior image of a pattern on a substrate.

BRIEF DESCRIPTION OF THE DRAWINGS

FIG. 7A is a cross-sectional view parallel to an XY plane of the mask holding member illustrating the mask holding member according to the first embodiment.

FIG. 7B is a view showing the mask holding member according to the first embodiment as seen from the +X side of the mask holding member.

DESCRIPTION OF EMBODIMENTS

Embodiments of the present invention will now be described with reference made to the drawings, however, the present invention is not limited to these embodiments. Note that, in the description given below, an XYZ rectangular coordinate system is set, and the positional relationships of the respective members are described while making reference to this XYZ rectangular coordinate system. A predetermined direction within a horizontal plane is taken as the X axial direction, a direction which is orthogonal to the X axial direction within the horizontal plane is taken as the Y axial direction, and a direction which is orthogonal (namely, a vertical direction) relative to both the X axial direction and the Y axial direction is taken as the Z axial direction. In addition, rotation (i.e., tilt) directions around the X axis, the Y axis, and the Z axis are taken respectively as the θX, θY, and θZ directions.

First Embodiment

Figure 1:
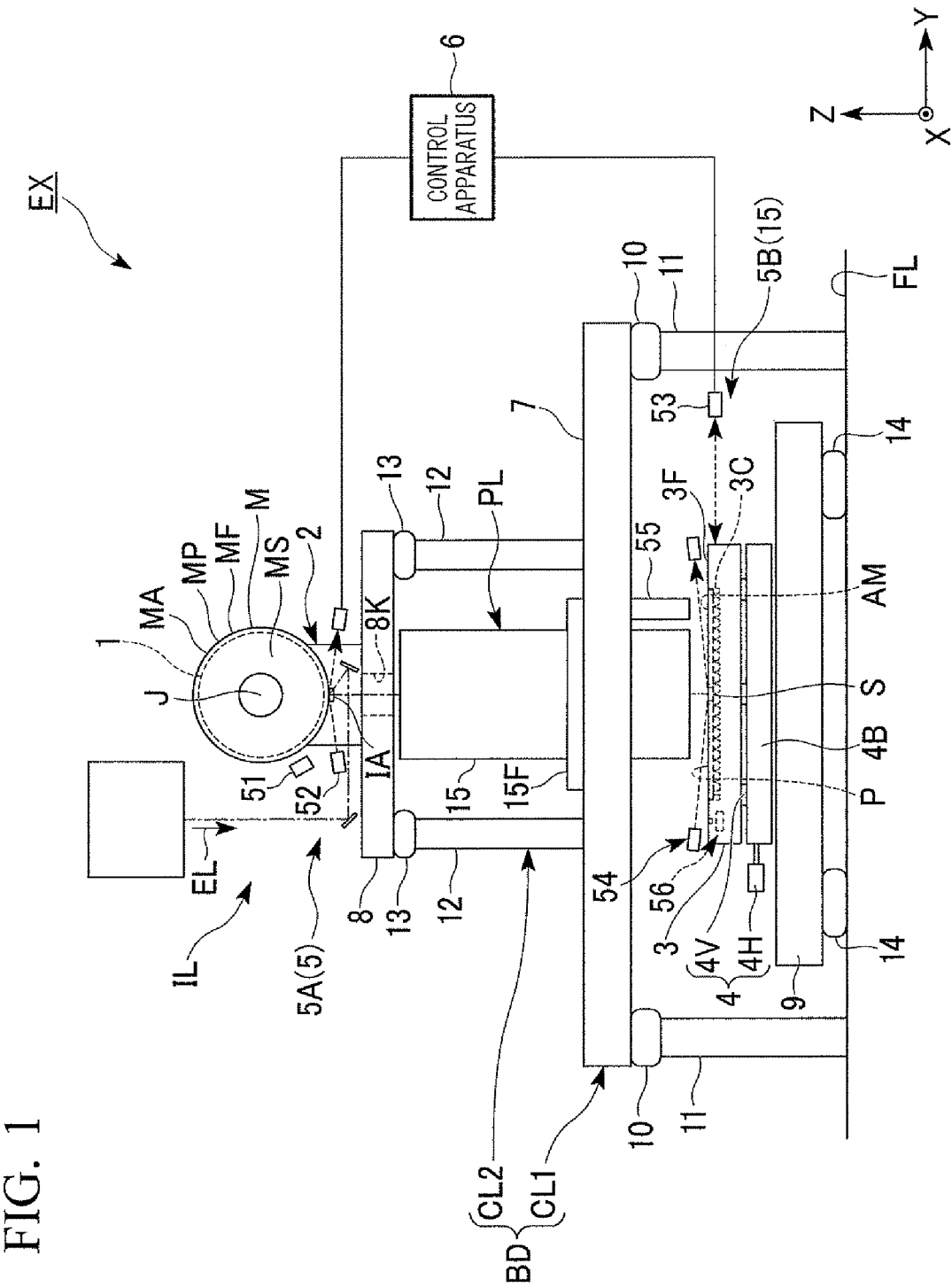
FIG. 1 is a schematic structural view showing an exposure apparatus according to a first embodiment.

The first embodiment will now be described. FIG. 1 is a schematic structural view showing an exposure apparatus EX according to the first embodiment. In FIG. 1, the exposure apparatus EX is provided with a mask holding member 1 which holds a mask M having a pattern MP, a mask driving apparatus 2 which is able to move the mask holding member 1 which is holding the mask M, a substrate holding member 3 which holds a substrate P, a substrate driving apparatus 4 which is able to move the substrate holding member 3 which is holding the substrate P, a detection system 5 which is able to acquire position information for the mask M and position information for the substrate P, an illumination system IL which illuminates the pattern MP on the mask M by means of an exposure light EL, a projection optical system PL which projects an image of the pattern MP on the mask M which has been illuminated by the exposure light EL onto the substrate P, and a control apparatus 6 which controls the overall operation of the exposure apparatus EX.

The mask M includes a reticle on which is formed a device pattern which is projected onto the substrate P. In the present embodiment, the mask M has a circular cylinder shape. The circular cylinder-shaped mask M has a center axis J, an outer circumferential surface MF which is placed around the center axis J, and side surfaces MS which are placed on both sides of the outer circumferential surface MF. In the present embodiment, the pattern MP is formed on the outer circumferential surface MF of the mask M. In the present embodiment, a plurality of the patterns MP are formed extending in the circumferential direction of the outer circumferential surface MF of the mask M. A pattern formation area MA on which the patterns MP are formed is set on the outer circumferential surface MF of the mask M so as to extend in the circumferential direction of the outer circumferential surface MF. In the description given below, at least a portion of the outer circumferential surface MF of the mask M where the patterns MP are formed and which is placed around the center axis J is suitably referred to as the pattern formation surface MF. Moreover, in the present embodiment, a reflective type of mask is used for the mask M.

The substrate P is obtained, for example, by forming a film of a photosensitive material (i.e., photoresist) on a substrate such as a semiconductor wafer or the like such as a silicon wafer. Additionally, various types of film such as a protective film (i.e., a top coat film) may be coated onto the photosensitive material. In the present embodiment, the substrate P has a substantially circular plate shape. The substrate P is held on the substrate holding member 3 such that a surface of the substrate P (i.e., an exposure surface) is substantially parallel with an XY plane. The substrate P which is being held on the substrate holding member 3 is substantially circular within the XY plane. A plurality of shot areas S (S1 through S26) which are areas for exposure where images of the patterns MP are formed are provided in a matrix layout on the substrate P.

In the present embodiment, the mask driving apparatus 2 includes an actuator such as, for example, a voice coil motor or a linear motor which is able to be driven by means of Lorentz's force, so that the mask holding member 1 which is holding a mask M is able to move in directions of the six degrees of freedom, namely, the X axial direction, the Y axial direction, the Z axial direction, and the θX, θY, and θZ directions.

Moreover, in the present embodiment, the substrate driving apparatus 4 includes an actuator such as, for example, a voice coil motor or a linear motor which is able to be driven by means of Lorentz's force, so that the substrate holding member 3 which is holding a substrate P is able to move in directions of the six degrees of freedom, namely, the X axial direction, the Y axial direction, the Z axial direction, and the θX, θY, and θZ directions.

In the present embodiment, the detection system 5 includes a first detection system 5A which is able to acquire position information for the mask M, and, consequently, position information relating to the patterns MP (i.e., the pattern formation area MA), and a second detection system 5B which is able to acquire position information for the substrate P, and, consequently, position information for the shot areas S. The first detection system 5A includes an encoder system 51, and a focus and leveling detection system 52. The second detection system 5B includes a laser interferometer system 53, a focus and leveling detection system 54, and an alignment system 55.

In the present embodiment, the first detection system 5A which includes the encoder system 51 and the focus and leveling detection system 52 is able to acquire position information for the mask M (i.e., the pattern MP) in the directions of the six degrees of freedom, namely, the X axial direction, the Y axial direction, the Z axial direction, and the θX, θY, and θZ directions.

Moreover, in the present embodiment, the second detection system 5B which includes the laser interferometer system 53, the focus and leveling detection system 54, and the alignment system 55 is able to acquire position information for the substrate P (i.e., the shot areas S) in the directions of the six degrees of freedom, namely, the X axial direction, the Y axial direction, the Z axial direction, and the θX, θY, and θZ directions.

The exposure apparatus EX is provided with a body BD which includes a first column CL1 which is provided, for example, on a floor FL inside a clean room, and with a second column CL2 which is provided on top of the first column CL1. The first column CL1 is provided with a plurality of first supporting pillars 11, and with a first base plate 7 which is supported on these first supporting pillars 11 via an anti-vibration apparatus 10. The second column CL2 is provided with a plurality of second supporting pillars 12 which are provided on top of the first base plate 7, and with a second supporting plate 8 which is supported on these second supporting pillars 12 via an anti-vibration apparatus 13.

The illumination system IL illuminates the pattern formation surface MF of the mask M where the pattern MP is formed by means of exposure light EL. The illumination system IL is able to set a predetermined illumination area IA on top of the pattern formation surface MF of the mask M, and is able to irradiate the exposure light EL at a uniform irradiation distribution onto this illumination area IA. The illumination system IL has an optical integrator to render uniform the illuminance of the exposure light EL emitted from a light source apparatus, a condenser lens to condense the exposure light EL from the optical integrator, a relay lens system, a field stop (a blind mechanism) to set the illumination region IA, and similar. As the exposure light EL emitted from the illumination system IL, for example, emission lines emitted from a mercury lamp (the g line, h line, i line), as well as KrF excimer laser light (wavelength 248 nm) and other deep-ultraviolet (DUV) light, as well as ArF excimer laser light (wavelength 193 nm), F2 laser light (wavelength 157 nm), and other vacuum ultraviolet (VUV) light is used. In this embodiment, ArF excimer laser light is used.

The mask holding member 1 holds the circular cylinder-shaped mask M which has the pattern formation surface MF on which the patterns MP are formed and which is formed around the center axis J. The mask driving apparatus 2 is able to drive the mask holding member 1 which is holding the mask M in directions of the six degrees of freedom, namely, the X axial direction, the Y axial direction, the Z axial direction, and the θX, θY, and θZ directions. At least a portion of the mask holding member 1 and the mask driving apparatus 2 which is capable of moving this mask holding member 1 is supported on a top surface of the second base plate 8. The mask holding member 1 is able to move in the directions of the six degrees of freedom over the second base plate 8 while holding the mask M.

The second base plate 8 has an aperture 8K which allows the exposure light EL to pass through. The exposure light EL which has been emitted from the illumination system IL and has illuminated the pattern formation surface MF of the mask M is reflected by the pattern formation surface MF of the mask M, and then passes through the aperture 8K of the second base plate 8, and is then irradiated into the projection optical system PL.

In the present embodiment, the mask holding member 1 holds the mask M such that the center axis J of the mask M and the X axis are substantially parallel with each other. Accordingly, when the mask M is being held on the mask holding member 1, the pattern formation surface MF of the mask M is placed around an axis which is substantially parallel with the X axis. The mask driving apparatus 2 is able to rotate the mask holding member 1 which is holding the mask M in the θX direction taking the center axis J as the axis of rotation, and is also able to move the mask holding member 1 which is holding the mask M in the directions of the six degrees of freedom. The mask M which is being held on the mask holding member 1 is able to be rotated by the mask driving apparatus 2 in at least the θX direction with the center axis J taken as the axis of rotation.

The first detection system 5A of the detection system 5 includes an encoder system 51 which is able to acquire at least one of position information for the pattern MP of the mask M in the circumferential direction (i.e., the θX direction) of the pattern formation surface MF, and position information for the patterns MP of the mask M in the direction of the center axis J (i.e., the X direction), and a focus and leveling detection system 52 which is able to acquire position information for the pattern formation surface MF of the mask M in a direction which is perpendicular to the center axis J (i.e., the Z axial direction). The control apparatus 6 drives the mask driving apparatus 2 based on detection results from the first detection system 5A which includes the encoder system 51 and the focus and leveling detection system 52 in order to control the position of the mask M being held on the mask holding member 1.

The projection optical system PL projects images of the patterns MP on the mask M onto the substrate P at a predetermined projection ratio β. The projection optical system PL has a plurality of optical elements, and these optical elements are held by a lens barrel 15. The lens barrel 15 has a flange 15F, and the projection optical system PL is supported on the first base plate 7 via the flange 15F. Moreover, an anti-vibration apparatus can be provided between the first base plate 7 and the lens barrel 15. The projection optical system PL of the present embodiment is a reducing system whose projection ratio is, for example, ¼, ⅕, ⅛, or the like. The projection optical system PL of the present embodiment projects inverted images of the patterns MP on the mask M onto the substrate P.

Note that the projection optical system PL may be any one of a reducing system, an equal system, and an enlarging system. The projection optical system PL may also form either one of an inverted image and an erect image. In addition, the projection optical system PL may be any one of a refractive system which does not include reflective optical elements, a reflective system which does not include refractive optical elements, and a reflective-refractive system which includes both reflective optical elements and refractive optical elements.

The substrate holding member 3 holds the circular plate-shaped substrate P which is coated with a film formed from a photosensitive material. The substrate holding member 3 has a suctioning mechanism which holds the substrate P by suction. In the present embodiment, a recessed portion 3C is formed in the substrate holding member 3. At least a portion of the suctioning mechanism which holds the substrate P by suction, as well as a holding surface which holds a rear surface of the substrate P are placed inside this recessed portion 3C. The top surface 3F of the substrate holding member 3 other than this recessed portion 3C is formed as a flat surface which has substantially the same height (i.e., is flush with) as the surface of the substrate P which is being held on the holding surface (i.e., by the suctioning mechanism).

The substrate driving apparatus 4 is able to move the substrate holding member 3 which is holding the substrate P in the directions of the six degrees of freedom, namely, the X axial direction, the Y axial direction, the Z axial direction, and the θX, θY, and θZ directions. The substrate holding member 3 and at least a portion of the substrate driving apparatus 4 which is able to move this substrate holding member 3 are supported on a top surface of a third base plate 9. The third base plate 9 is supported on the floor surface FL via an anti-vibration apparatus 14. The substrate holding member 3 is able to move in the directions of the six degrees of freedom on the third base plate 9 while holding the substrate P.

In the present embodiment, the substrate holding member 3 holds the substrate P such that a surface (i.e., an exposure surface) of the substrate P is substantially parallel with the XY plane. The substrate driving apparatus 4 is able to move the substrate holding member 3 which is holding the substrate P in at least a predetermined one-dimensional direction. The substrate P which is being held on the substrate holding member 3 is able to be moved in at least the predetermined one-dimensional direction by the substrate driving apparatus 4.

The second detection system 5B of the detection system 5 includes a laser interferometer system 53 which is able to acquire position information in the X axial, the Y axial, and the θZ directions for the substrate holding member 3 which is holding the substrate P (and, consequently, for the substrate P), and a focus and leveling detection system 54 which is able to acquire surface position information in the X axial, the Y axial, and the θY directions for the surface of the substrate P which is being held on the substrate holding member 3. The control apparatus 6 controls the position of the substrate P which is being held on the substrate holding member 3 by driving the substrate driving apparatus 4 based on detection results from the second detection system 5B which includes the laser interferometer system 53 and the focus and leveling detection system 54.

Moreover, in the present embodiment, the exposure apparatus EX is provided with an off-axis alignment system 55 which detects alignment marks AM and the like which are formed on the substrate P. At least a portion of the alignment system 55 is located in the vicinity of a distal end of the projection optical system PL. The alignment system 55 of the present embodiment employs an FIA (Field Image Alignment) alignment system such as that disclosed in, for example, Japanese Patent Application Publication No. H04-65603 A (corresponding to U.S. Pat. No. 5,493,403). In this system, broadband detection light that does not photosensitize the photosensitive material on the substrate P is irradiated onto subject marks (i.e., the alignment marks AM or the like which are formed on the substrate P), and an image of the subject marks which is formed on the light receiving surface by reflected light from the subject marks, and an image of an index (i.e., index marks on an index plate provided in the alignment system 55) are picked up using an image pickup device such as a CCD or the like. Image processing is then performed on these picked up image signals, thereby enabling the positions of the marks to be measured.

Figure 2:
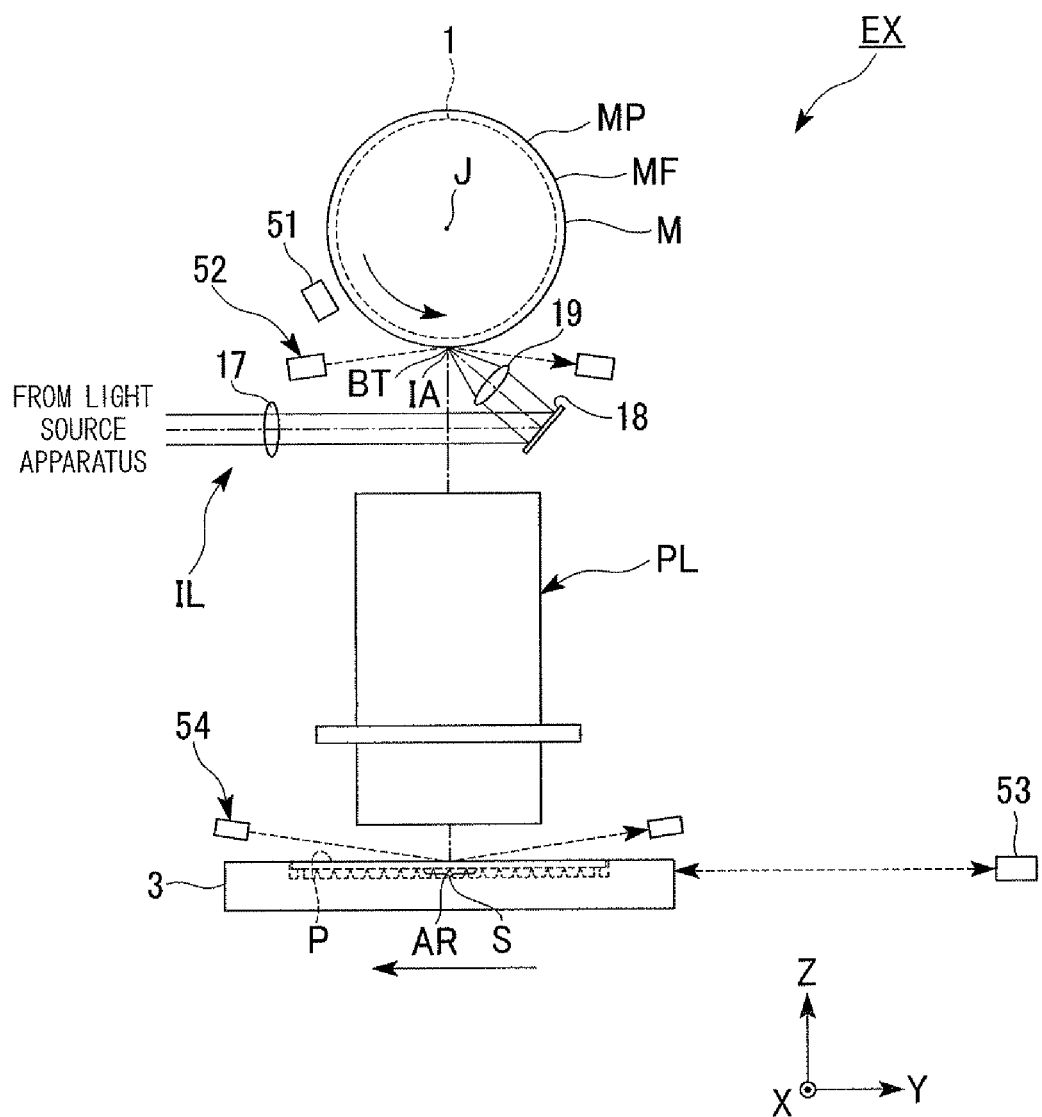
FIG. 2 is a typical view showing an exposure apparatus EX of the first embodiment.

FIG. 2 is a typical view showing the exposure apparatus EX of the present embodiment. The exposure apparatus EX of the present embodiment is a scanning type of exposure apparatus (what is known as a scanning stepper) which projects an image of the patterns MP on the mask M onto the substrate P while moving the mask M and the substrate P in synchronization in their respective predetermined scanning directions. In the present embodiment, the scanning direction (i.e., the synchronized movement direction) of the substrate P is taken as the Y axial direction, while the scanning direction (i.e., the synchronized movement direction) of the mask M is taken as the θX direction.

The exposure apparatus EX projects onto the substrate P an image of the patterns MP on the mask M via the projection optical system PL while moving the substrate P in the Y axial direction in synchronization with the movement (i.e., the rotation) of the mask M in the θX direction using both the mask driving apparatus 2 and the substrate driving apparatus 4. The exposure apparatus EX moves the shot areas S on the substrate P in the Y axial direction relative to the projection area AR of the projection optical system PL, and in synchronization with this movement of the substrate P in the Y axial direction, illuminates the illumination area IA with the exposure light EL while moving (i.e., rotating) the pattern formation surface MF of the mask M in the θX direction, with the center axis J taken as the axis of rotation, relative to the illumination area IA of the illumination system IL. The exposure apparatus EX then irradiates the exposure light EL onto the projection area AR via the projection optical system PL. As a result, the shot areas S on the substrate P are exposed with images of the patterns MP which is formed on the projection area AR.

As is described above, in the present embodiment, the projection optical system PL projects inverted images of the patterns MP on the mask M onto the substrate P. When the images of the patterns MP on the mask M are being projected onto the shot areas S on the substrate P, as is shown by the arrow in FIG. 2, the control apparatus 6, for example, rotates the mask M in a direction from the Y axis towards the Z axis (i.e., in an anti-clockwise rotation when the mask M is viewed from the +X direction) in synchronization with the movement of the substrate P in the −Y direction. In the description given below, a rotation direction from the Y axis towards the Z axis (i.e., an anticlockwise rotation when the mask M is viewed from the +X direction) is referred to where appropriate as a +θX direction, while the opposite direction to this is referred to where appropriate as the −θX direction.

As is shown in FIG. 2, in the present embodiment, the illumination system IL is provided with a reflective optical element 18 which is located between the mask M and the projection optical system PL. Moreover, in the present embodiment, the illumination system IL is placed on the light source apparatus side relative to the reflective optical element 18, and is provided with a first cylindrical lens 17 which guides the exposure light EL to the reflective optical element 18, and a second cylindrical lens 19 which is entered by the exposure light EL that has been guided by the first cylindrical lens 17 to the reflective optical element 18 and has been reflected by this reflective optical element 18, and that guides this exposure light EL to the pattern formation surface MF of the mask M.

The first cylindrical lens 17 corrects the cross-sectional configuration of the exposure light EL which has been set by the field diaphragm or the like of the illumination system IL. The reflective optical element 18 reflects the exposure light EL from the first cylindrical lens 17, and thereby changes the orientation of the optical path of the exposure light EL. The second cylindrical lens 19 corrects the cross-sectional configuration of the exposure light EL from the reflective optical element 18.

In the present embodiment, the illumination system IL which includes the first cylindrical lens 17 and the second cylindrical lens 19 sets the illumination area IA on the pattern formation surface MF of the mask M in a slit shape (i.e., a rectangular shape) which has the X axial direction as the longitudinal direction thereof. Moreover, in the present embodiment, the illumination system IL illuminates a bottommost portion BT of the pattern formation surface MF of the circular cylinder-shaped mask M using the exposure light EL.

As has been described above, in the present embodiment, a reflective type of mask is used for the mask M. The exposure light EL which is irradiated onto the pattern formation surface MF by the illumination system IL and is then reflected by this pattern formation surface MF is irradiated via the projection optical system PL onto the substrate P. The images of the patterns MP on the mask M are formed via the projection optical system PL on the substrate P. In order to project the images of the patterns MP on the mask M onto the substrate P and thereby expose this substrate P, the control apparatus 6 irradiates the exposure light EL onto the pattern formation surface MF of the mask M using the illumination system IL while rotating the mask M, with the center axis J taken as the axis of rotation, using the mask driving apparatus 2.

Figure 3:
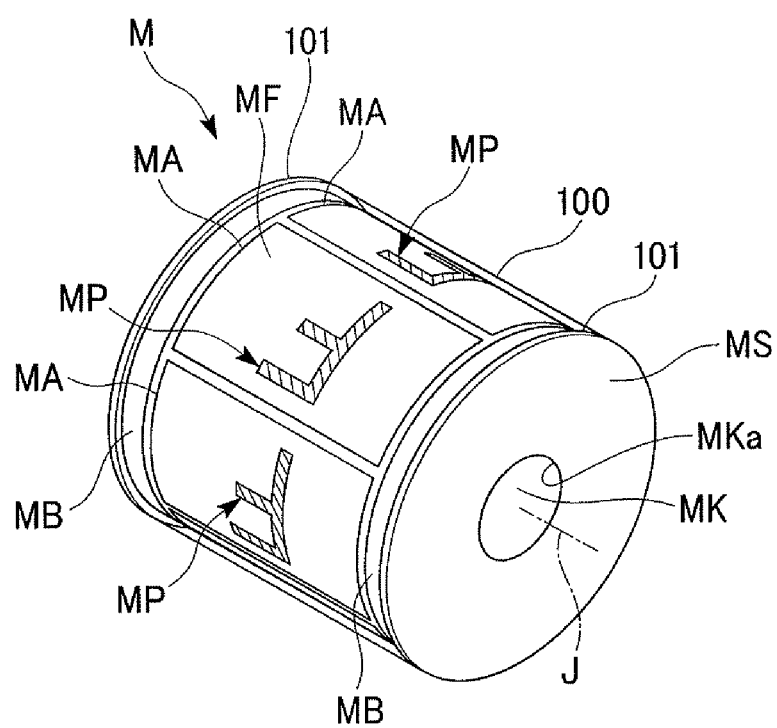
FIG. 3 is a perspective view showing a mask according to the first embodiment.
Figure 4A:
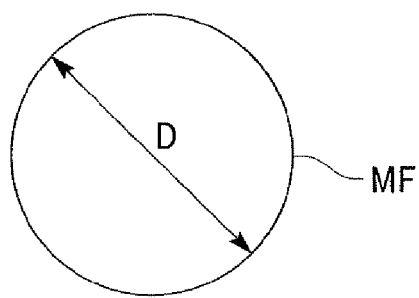
FIG. 4A is a typical view in order to illustrate the mask according to the first embodiment, and shows a side surface of a mask.
Figure 4B:
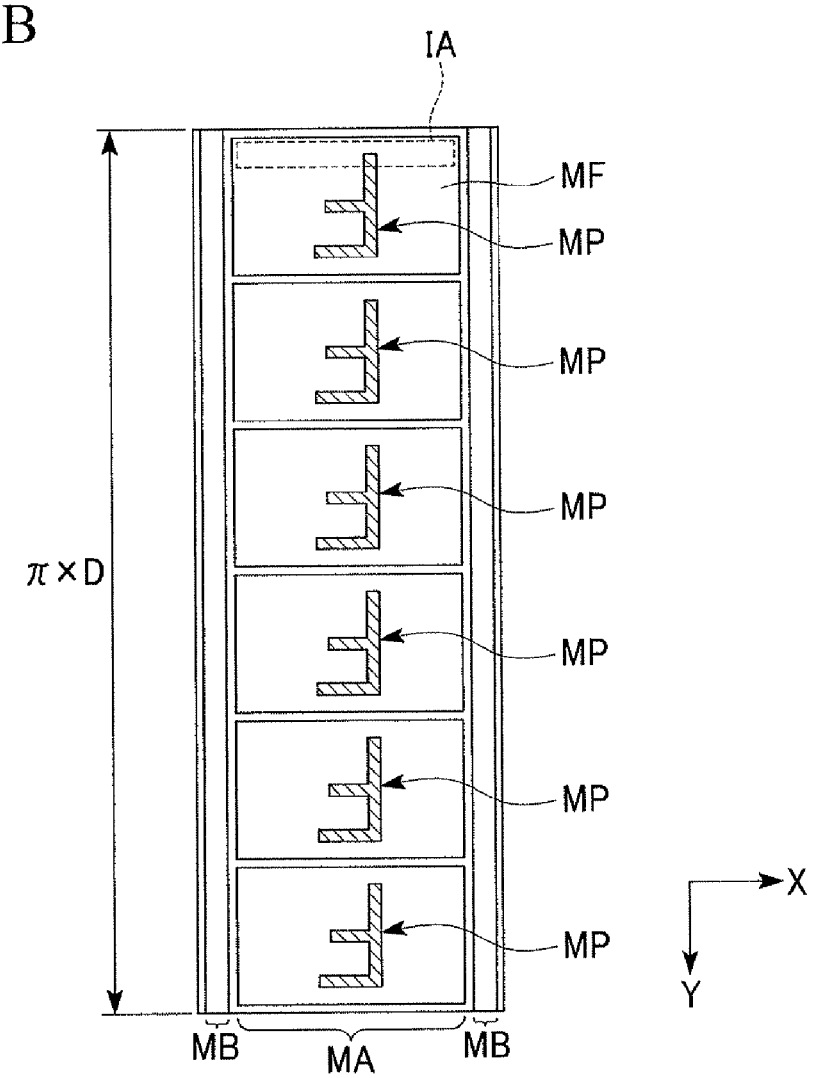
FIG. 4B is a view in order to illustrate the mask according to the first embodiment, and shows a pattern formation surface of a mask which has been unrolled along an XY plane.

Next, the mask M will be described. FIG. 3 is a perspective view showing the mask M, FIG. 4A is a typical view of the pattern formation surface MF of the mask M, and FIG. 4B is a view showing the pattern formation surface MF of the mask M unrolled along the XY plane.

As is shown in FIG. 3, the mask M has a circular cylinder shape. The mask M has a pattern formation surface MF which is positioned around the center axis J, and on which the patterns MP are formed. In FIG. 3, the center axis J is parallel to the X axis. The mask M is able to be rotated in the θX direction with the center axis J taken as the axis of rotation by the driving of the mask driving apparatus 2.

The circular cylinder-shaped mask M is provided with an internal space MK, and with an aperture MKa which is formed on both sides (i.e., on the +X side and on the −X side) of the internal space MK so as to connect this internal space MK with the external space. The circular cylinder-shaped mask M has side surfaces MS on both sides of the pattern formation surface MF. The side surfaces MS of the mask M have a substantially toroidal shape within a YZ plane, and are positioned so as to encircle the aperture MKa. In FIG. 3, the side surfaces MS of the mask M are substantially parallel with the YZ plane. In the present embodiment, because the mask M has a hollow structure in which the internal space MK is provided, it is possible to achieve a reduction in the weight of the mask M.

A plurality of the patterns MP are formed extending in the circumferential direction on the pattern formation surface MF. A plurality of pattern formation areas MA on which the patterns MP are formed are provided on the pattern formation surface MF of the mask M extending in the circumferential direction of this pattern formation surface MF. The patterns MP which are to be projected onto the substrate P are formed on each one of this plurality of pattern formation areas MA.

When the pattern formation surface MF is unrolled along the XY plane, the shape of the patterns MP formed on this pattern formation surface MF is similar to the shape of the image of the patterns MP which are formed on the substrate P via the projection optical system PL. In the present embodiment, as an example, patterns MP having the shape of the letter F are formed on the pattern formation area MA.

Moreover, as is shown in FIG. 4B, in the present embodiment, the illumination area IA of the illumination system IL is provided in a slit shape which has the X axial direction as the longitudinal direction thereof.

The mask M is made up of a circular cylinder-shaped substrate which is formed from a glass material such as quartz or the like, or from a ceramic (i.e., a low expansion ceramic) or the like on which the predetermined patterns MP are formed using a metal film made of, for example, chrome (Cr) or the like.

Furthermore, in the present embodiment, mark formation areas MB, on which are formed marks which are detected by the detection system 5, are provided on the outer side of the pattern formation area MA of the outer circumferential surface MF of the mask M at both one end side (i.e., the +X side) and another end side (i.e., the −X side) in the direction of the center axis J (i.e., the X axial direction). Note that, in order to make the drawings more easily understandable, the marks are not shown in FIG. 3 and FIGS. 4A and 4B.

As is shown in FIG. 3, the mask M is provided with a pellicle 100 which is formed in a circular cylinder shape so as to cover the pattern formation surface MF, and with support members (i.e., pellicle frames) 101 which support the pellicle 100. The support members 101 are formed extending in the circumferential direction of the pattern formation surface (i.e., the outer circumferential surface) MF so as to encircle the center axis J, and are formed in predetermined areas on the outer side of the mark formation areas MB on both the one end side and the other end side in the direction of the center axis J (i.e., in the X axial direction) of the pattern formation surface (i.e., the outer circumferential surface) MF of the mask M. The pellicle 100 which is supported by the support members 101, and the pattern formation surface ME of the mask M are separated from each other.

In the present embodiment, the support members 101 are toroidal members. The support members 101 are formed from a material having pliability (i.e., flexibility) such as, for example, polytetrafluoroethylene, and are able to perfectly connect to the pattern formation surface ME, which is a curved surface. The support members 101 are connected to the pattern formation surface MF of the mask M in predetermined areas on the outer side of the mark formation areas MB on both the one end side and the other end side in the direction of the center axis J (i.e., in the X axial direction) of the pattern formation surface MF of the mask M.

In the present embodiment, because the pellicle 100 is provided so as to cover the pattern formation surface MF, it is possible to substantially prevent any foreign matter becoming adhered to the pattern formation surface ME, and to thereby protect the pattern formation surface MF.

Figure 5:
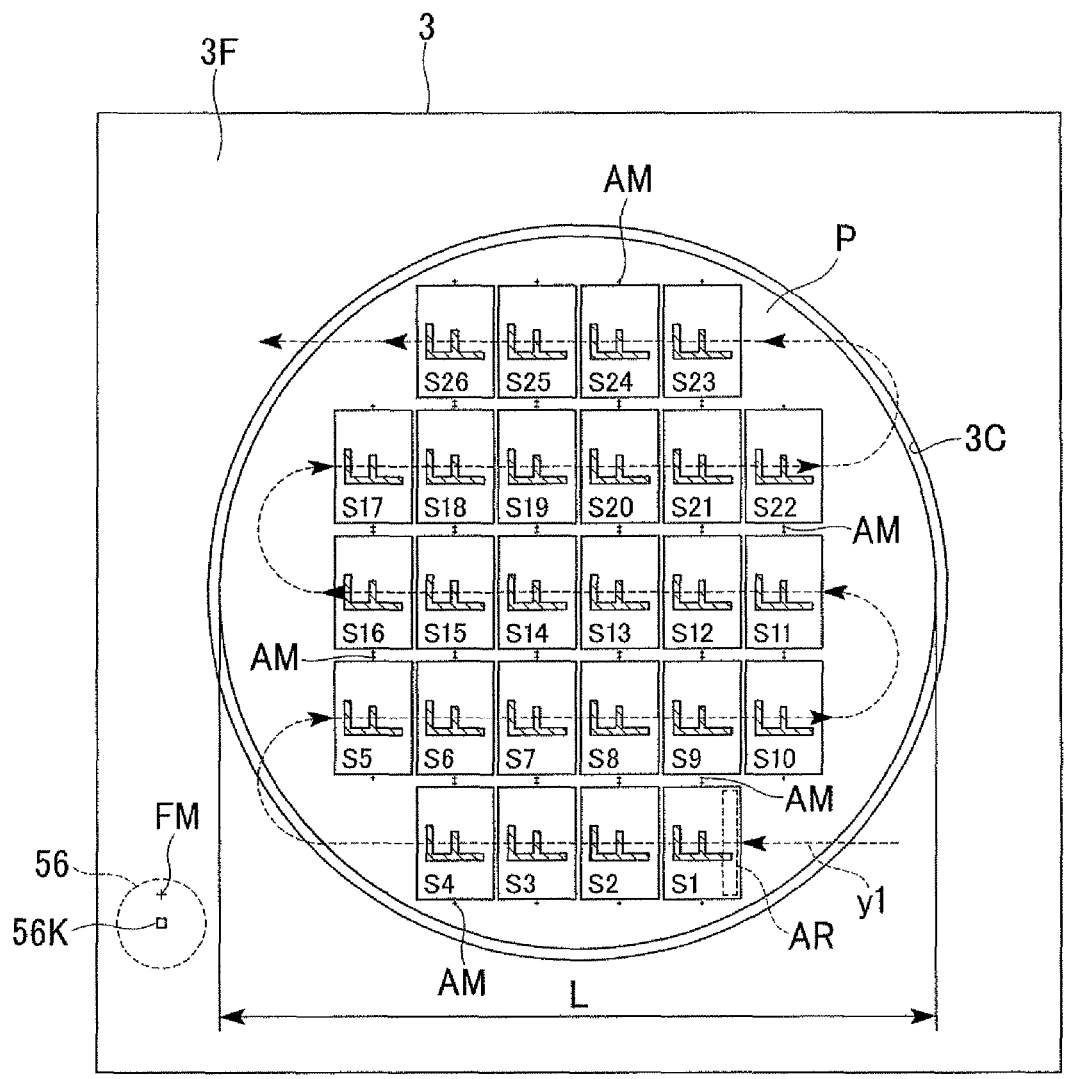
FIG. 5 is a plan view showing a substrate holding member which is holding the substrate according to the first embodiment.

FIG. 5 is a plan view of the substrate holding member 3. As is shown in FIG. 5, the plurality of shot areas S (S1 through S26) which are areas to be exposed are provided in a matrix layout on the substrate P, and the plurality of alignment marks AM are provided so as to correspond to the respective shot areas S1 through S26. Moreover, as is shown in FIG. 5, in the present embodiment, the projection area AR of the projection optical system PL is set so as to be slit-shaped with the X axial direction taken as the longitudinal direction thereof. The substrate P also has a substantially circular shape within the XY plane.

When exposing each of the shot areas S1 through S26 on the substrate P, the control apparatus 6 irradiates the exposure light EL onto the substrate P by, for example, irradiating the exposure light EL onto the projection area AR while moving the projection area AR of the projection optical system PL relatively to the substrate P as is shown by the arrow y1 in FIG. 5. The control apparatus 6 controls the operations of the substrate holding member 3 using the substrate driving apparatus 4 such that the projection area AR moves in the direction of the arrow y1 relative to the substrate P.

The reference mark FM which is detected by the above described alignment system 55 is formed at a predetermined position on the top surface of the substrate holding member 3. In addition, an aperture 56K is formed at a predetermined position relative to the reference mark FM on the top surface of the substrate holding member 3 which can be placed on the image plane side (i.e., the light emitting surface side) of the projection optical system PL. At least a portion of a light receiving device 56 which is able to receive light via the projection optical system PL and the aperture 56K is positioned below (i.e., in the Z direction) this aperture portion 56K. In the present embodiment, the light receiving device 56 includes a spatial image measuring instrument such as that disclosed in, for example, Japanese Patent Application Publication No. 2002-14005 A (corresponding to U.S. Patent Application Publication No. 2002/0041377 A).

In the present embodiment, if the diameter of the mask M on the pattern formation surface MF is taken as D, if the maximum length of the substrate P in the scanning direction of the substrate P (i.e., the Y axial direction in the present embodiment) is taken as L, if the projection ratio of the projection optical system PL is taken as β, and if the circumference ratio is taken as π, then the conditions for the following formula are satisfied.

$$D \geq (\beta \times L)/\pi \quad (1)$$

In the present embodiment, the diameter D of the mask M on the pattern formation surface MF is determined in accordance with the maximum length L of the substrate P and with the projection ratio β of the projection optical system PL in order that the conditions for Formula (1) are satisfied.

Here, as is described above, in the present embodiment, the substrate P is substantially circular within the XY plane. In the present embodiment, the maximum length L of the substrate P in the scanning direction of the substrate P (i.e., in the Y axial direction) is the diameter of the substrate P.

Moreover, as is shown in FIG. 5, a plurality of the shot areas S onto which the images of the patterns MP of the mask M are projected are provided on the substrate P extending in at least the scanning direction of the substrate P (i.e., in the Y axial direction). In addition, the number of patterns MP of the mask M which are formed extending in the circumferential direction on the pattern formation surface MF is equal to the maximum number of shot areas S extending in at least the scanning direction of the substrate P (i.e., in the Y axial direction).

In the present embodiment, as is shown in FIG. 5, four shot areas S1 through S4 are provided in the Y axial direction, then six shot areas S5 through S10 are provided in the Y axial direction, then six shot areas S11 through S16 are provided in the Y axial direction, then six shot areas S17 through S22 are provided in the Y axial direction, then four shot areas S23 through S26 are provided in the Y axial direction. Accordingly, in the present embodiment, the maximum number of shot areas S in the Y axial direction is six. The number of pattern formation areas MA where the patterns MP of the mask M are formed extending in the circumferential direction of the pattern formation surface MF is six.

Figure 6:
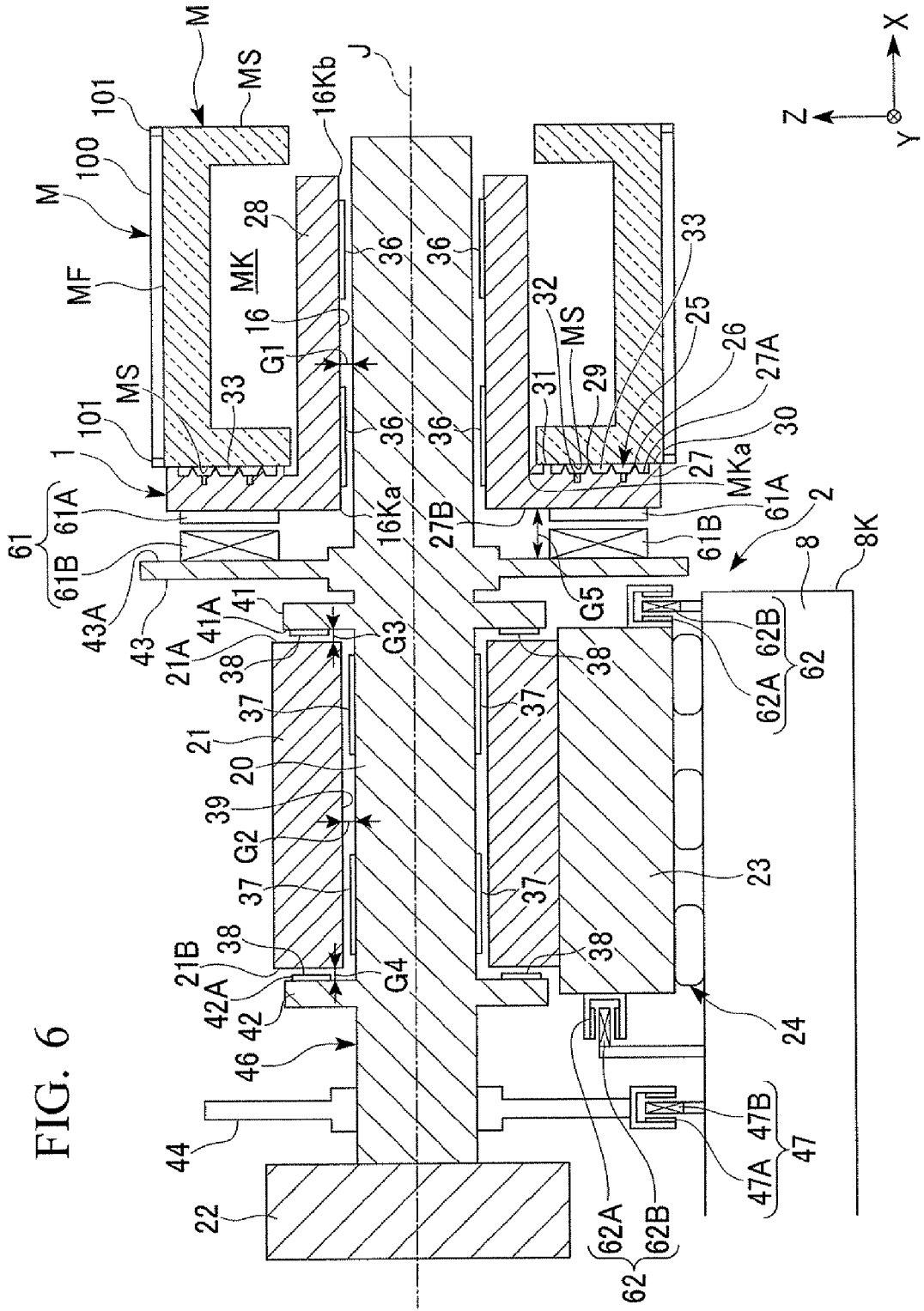
FIG. 6 is a side cross-sectional view showing the vicinity of a mask holding member and a mask driving apparatus according to the first embodiment.

Next, the mask holding member 1 and the mask driving apparatus 2 will be described. FIG. 6 is a side cross-sectional view showing the vicinity of the mask holding member 1 and the mask driving apparatus 2. In FIG. 6, the exposure apparatus EX is provided with the mask holding member 1 which holds the mask M, and with the mask driving apparatus 2 which is able to move the mask holding member 1 when it is holding the mask M. At least a portion of the mask holding member 1 and the mask driving apparatus 2 is provided on a second base plate 8.

The exposure apparatus EX is provided with a shaft member 20 which supports the mask holding member 1 which is holding the mask M such that the mask holding member 1 is able to rotate with the center axis J taken as the axis of rotation, and with a support member 21 which rotatably supports the shaft member 20. The support member 21 is a substantially cylinder-shaped member.

The mask holding member 1 has a hole 16 that is used to position at least a portion of the shaft member 20. The hole 16 has an aperture 16Ka on at least the −X side. In the present embodiment, the hole 16 is formed so as to penetrate a portion of the mask holding member 1 in the X axial direction, and apertures 16Ka and 16Kb are formed respectively on both sides (i.e., on the +X side and the −X side) of the hole 16.

The mask holding member 1 is positioned on one end side (i.e., on the +X side) of the shaft member 20. The exposure apparatus EX has a weight member 22 which is positioned on the other end side (i.e., on the −X side) of the shaft member 20. The weight member 22 is connected to the other end of the shaft member 20. The shaft member 20 and the weight member 22 are an integral body. The support member 21 which rotatably supports the shaft member 20 is positioned between the mask holding member 1 and the weight member 22. The support member 21 is supported on a top surface of a base member 23. The support member 21 is connected to the top surface of the base member 23. The support member 21 and the base member 23 are an integral body. The base member 23 which supports the support member 21 is supported on the top surface of the second base plate 8 via an anti-vibration apparatus 24. The anti-vibration apparatus 24 is able to suppress vibrations which arise as a result of the movement of the mask holding member 1. The anti-vibration apparatus 24 includes an actuator which can be driven by Lorentz's force, and with a damper mechanism such as an air mount.

The mask holding member 1 removably holds a side surface MS of the circular cylinder-shaped mask M which has the pattern formation surface MF which is positioned around the center axis J and on which the patterns MP are formed. The mask holding member 1 has a suctioning mechanism 25 which is able to suction the side surface MS of the mask M.

The mask holding member 1 is provided with a holding surface 26 which is positioned so as to face the side surface MS on the −X side of the mask M, and which removably holds this side surface MS on the −X side of the mask M. The suctioning mechanism 25 is able to suction the side surface MS of the mask M onto the holding surface 26. The holding surface 26 of the mask holding member 1 includes a first surface 27A of a base material 27 (described below), end surfaces of pin members 29, an end surface of a first circumferential wall member 30, and an end surface of a second circumferential wall member 31.

FIG. 7A and FIG. 7B show the mask holding member 1. FIG. 7A is a cross-sectional view parallel with the XZ plane of the mask holding member 1, while FIG. 7B is a view as seen from the +X side of the mask holding member 1. The mask holding member 1 is provided with the base material 27, the pin members 29 which are formed on the base material 27 and which are able to support the side surface MS of the mask M, a first circumferential wall member 30 which is formed on the base material 27 and which is able to face the outer edge area of the side surface MS of the mask M, a second circumferential wall member 31 which is formed on the base material 27 and which is able to face an inner edge area (i.e., an area in the vicinity of the aperture MKa) of the side surface MS of the mask M, and suction apertures 32 which are formed in the base material 27 and are able to suction vapor.

The base material 27 of the mask holding member 1 has shape which corresponds to the mask M. As is described above, in the present embodiment, the side surfaces MS of the mask M are substantially toroidal within the YZ plane. A first surface 27A of the base material 27 which is able to face a side surface MS of the mask M is formed in a substantially toroidal shape within the YZ plane so as to face the side surface MS of the mask M. In the present embodiment, the first surface 27A of the base material 27 faces towards the +X side. The holding surface 26 is located on the first surface 27A side of the base material 27.

Moreover, in the present embodiment, the mask holding member 1 has a protruding portion 28 which is formed such that it protrudes on the +X side from the holding surface 26. The protruding portion 28 is connected to a central portion within the YZ plane of the base material 27. The hole 16 which is used to position the shaft member 20 is formed such that it penetrates the base material 27 and the protruding portion 28 in the X axial direction. At least a portion of the protruding portion 28 is able to be positioned in the internal space MK of the mask M which is held on the holding surface 26.

The first circumferential wall member 30 is formed on an outer edge area of the first surface 27A of the base material 27. The first circumferential wall member 30 is formed in a substantially toroidal shape which corresponds to the outer configuration of the side surface MS of the mask M. The first circumferential wall member 30 has an outer diameter which is slightly smaller than the outer diameter of the side surface MS of the mask M. The first circumferential wall member 30 has an end surface which is able to face the outer edge area of the side surface MS of the mask M which is held on the mask holding member 1. The end surface of the first circumferential wall member 30 is flat and has a predetermined width.

The second circumferential wall member 31 is formed on an inner edge area of the first surface 27A of the base material 27. The second circumferential wall member 31 is formed in a substantially toroidal shape which corresponds to the aperture MKa of the side surface MS of the mask M. The second circumferential wall member 31 has an outer diameter which is slightly larger than the outer diameter of the aperture MKa which is encircled by the side surface MS of the mask M. The second circumferential wall member 31 has an end surface which is able to face the inner edge area of the side surface MS of the mask M which is held on the mask holding member 1. The end surface of the second circumferential wall member 31 is flat and has a predetermined width.

A plurality of the pin members 29 are formed on the first surface 27A of the base material 27. The first circumferential wall member 30 is positioned so as to encircle the second circumferential wall member 31, and the plurality of pin members 29 are positioned uniformly on the first surface 27A of the base material 27 between the first circumferential wall member 30 and the second circumferential wall member 31. Each of the pin members 29 has an end surface which is able to face the side surface MS of the mask M. The end surfaces of the pin members 29 are flat. Each of the end surfaces of the plurality of pin members 29 is provided in substantially the same position in the X axial direction.

In the present embodiment, the end surfaces of the pin members 29, the end surface of the first circumferential wall member 30, and the end surface of the second circumferential wall member 31 are provided in substantially the same position in the X axial direction. Namely, the end surfaces of the plurality of pin members 29, the end surface of the first circumferential wall member 30, and the end surface of the second circumferential wall member 31 are positioned on substantially the same plane (i.e., on the YZ plane), so as to be mutually flush with each other. The end surfaces of the pin members 29, the end surface of the first circumferential wall member 30, and the end surface of the second circumferential wall member 31 are able to come into contact with the side surface MS of the mask M. As is shown in FIG. 6, as a result of each of the end surfaces of the pin members 29, the end surface of the first circumferential wall member 30, and the end surface of the second circumferential wall member 31 being placed in contact with the side surface MS of the mask M, a space 33 is formed on the −X side of the mask M which is enclosed by the side surface MS of the mask M, the first circumferential wall member 30, the second circumferential wall member 31, and the base material 27.

The suction apertures 32 hold the mask M using suction. The suction apertures 32 are formed respectively in a plurality of predetermined positions in the first surface 27A of the base material 27 between the first circumferential wall member 30 and the second circumferential wall member 31. The suction apertures 32 are each provided in a plurality of predetermined positions on the first surface 27A of the base material 27 which are different from the positions of the pin members 29.

The suctioning mechanism 25 which is able to suction the side surface MS of the mask M includes the suction apertures 32 which are formed in the first surface 27A of the base material 27, and a suctioning apparatus 34 which includes a vacuum system or the like which is able to suction a vapor via the suction apertures 32. As is shown in FIG. 7A, the suctioning apparatus 34 is provided externally of the mask holding member 1, and each of the suction apertures 32 is connected via a flow path 35 to the suctioning apparatus 34. At least a portion of the flow path 35 which connects each of the suction apertures 32 with the suctioning apparatus 34 is formed inside the base material 27.

The suctioning apparatus 34 is able to place the space 33 which is enclosed by the side surface MS of the mask M, the first circumferential wall member 30, the second circumferential wall member 31, and the base material 27 in a state of negative pressure. Namely, by suctioning the vapor in the space 33 via the suction apertures 32, the suctioning apparatus 34 is able to lower the pressure inside the space 33 to below the pressure of the space outside the space 33 (for example, atmospheric pressure). In the present embodiment, the mask holding member 1 has the pin members 29, and accordingly has what is known as a pin chuck mechanism.

The control apparatus 6 drives the suctioning apparatus 34 of the suctioning mechanism 25 so as to suction the vapor inside the space 33 and place this space 33 in negative pressure. As a result, the mask M is held using suction by the holding surface 26 which includes the end surfaces of the pin members 29, the end surface of the first circumferential wall member 30, and the end surface of the second circumferential wall member 31.

Moreover, the control apparatus 6 controls the suctioning mechanism 25 which includes the suctioning apparatus 34 so that the suctioning of the mask M by the suctioning mechanism 25 is canceled. As a result, the mask M can be removed from the holding surface 26.

In this manner, in the present embodiment, as a result of the control apparatus 6 controlling the suctioning mechanism 25 which is provided in the mask holding member 1, it is possible to mount the mask M on the holding surface 26 of the mask holding member 1, and to also remove the mask M from the holding surface 26 of the mask holding member 1.

Note that in the present embodiment, the suctioning mechanism 25 is provided with a vacuum suctioning mechanism which vacuum suctions the mask M, however, it is also possible for it to be provided with an electrostatic holding mechanism which uses electrostatic force. The mask holding member 1 is still able to removably hold the mask M even if an electrostatic holding mechanism is used.

As is shown in FIG. 6, at least a portion of the shaft member 20 can be positioned in the hole (i.e., in the internal space) 16 in the mask holding member 1. The end of the shaft member 20 on the +X side is positioned further on the +X side than the holding surface 26 of the mask holding member 1. Moreover, the outer surface of the shaft member 20 faces the inner surface of the hole 16 of the mask holding member 1 (i.e., the protruding portion 28). Of the mask holding member 1, at least a portion of the shaft member 20 and the mask holding member 1 (i.e., the protruding portion 28) which are positioned on the +X side of the holding surface 26 are able to be placed inside the internal space MK of the mask M which is held on the holding surface 26.

Moreover, in the present embodiment, the mask M which is held on the holding surface 26 of the mask holding member 1 is separated from the mask holding member 1 (i.e., the protruding portion 28) and the shaft member 20 which are positioned inside the internal space MK of this mask M.

As is shown in FIG. 6, the exposure apparatus EX has first gas bearings 36 which are formed between the mask holding member 1 and the shaft member 20, and with second gas bearings 37 and third gas bearings 38 which are formed between the shaft member 20 and the support member 21.

As is described above, the mask holding member 1 which includes the protruding portion 28 has an inner surface which faces the outer surface of the shaft member 20. The hole 16 has a circular shape within an XY plane. At least that portion of the shaft member 20 which is positioned on the inner side of the hole 16 also has a circular shape within an XY plane. The outer diameter of that portion of the shaft member 20 which is positioned on the inner side of the hole 16 is slightly smaller than the inner diameter of the hole 16. A predetermined gap (i.e., a first gap) G1 is formed between the inner surface of the mask holding member 1 and the outer surface of the shaft member 20.

The first gas bearings 36 are formed between the inner surface of the mask holding member 1 and the outer surface of the shaft member 20. The mask holding member 1 is supported without being in contact with the shaft member 20 by the first gas bearings 36. The gap (i.e., the first gap) G1 between the inner surface of the mask holding member 1 and the outer surface of the shaft member 20 is kept substantially constant by the first gas bearings 36. The shaft member 20 supports the mask holding member 1 such that it is able to rotate with the center axis J taken as the axis of rotation.

In the present embodiment, the first gap G1 is kept substantially constant by the first gas bearings 36, so that movement of the mask holding member 1 relative to the shaft member 20 in the Y axial direction, the Z axial direction, the θY direction, and the θZ direction is restricted. The mask holding member 1 is only able to move relative to the shaft member 20 in the X axial direction and the θX direction.

The support member 21 is a substantially cylinder-shaped member. The support member 21 has a hole (i.e., an internal space) 39 in which at least a portion of the shaft member 20 can be placed. The hole 39 is formed so as to penetrate the support member 21 in the X axial direction. At least a portion of the shaft member 20 is positioned on the inner side of the hole 39 in the cylindrical support member 21.

The support member 21 has an inner surface which faces the outer surface of the shaft member 20. The hole 39 has a circular shape within an XY plane. At least that portion of the shaft member 20 which is positioned on the inner side of the hole 39 also has a circular shape within an XY plane. The outer diameter of that portion of the shaft member 20 which is positioned on the inner side of the hole 39 is slightly smaller than the inner diameter of the hole 39. A predetermined gap (i.e., a second gap) G2 is formed between the inner surface of the support member 21 and the outer surface of the shaft member 20.

The second gas bearings 37 are formed between the inner surface of the support member 21 and the outer surface of the shaft member 20. The shaft member 20 is supported without being in contact with the support member 21 by the second gas bearings 37. The gap (i.e., the second gap) G2 between the inner surface of the support member 21 and the outer surface of the shaft member 20 is kept substantially constant by the second gas bearings 37. The support member 21 supports the shaft member 20 such that it is able to rotate with the center axis J taken as the axis of rotation.

The support member 21 has a first side surface 21A which faces the +X side, and a second side surface 21B which faces the −X side. Both the first side surface 21A and the second side surface 21B are flat. The shaft member 20 has a first flange 41 which has a facing surface 41A which faces the first side surface 21A on the +X side of the support member 21, and a second flange 42 which has a facing surface 42A which faces the second side surface 21B on the −X side of the support member 21. Each of the first side surface 21A, the second side surface 21B, the facing surface 41A, and the facing surface 42A are substantially parallel within a YZ plane. The distance in the X axial direction between the first side surface 21A and the second side surface 21B is slightly smaller than the distance in the X axial direction between the facing surface 41A of the first flange 41 and the facing surface 42A of the second flange 42. A predetermined gap (i.e., a third gap) G3 is formed between the first side surface 21A and the facing surface 41A, and a predetermined gap (i.e., a fourth gap) G4 is formed between the second side surface 21B and the facing surface 42A.

The third gas bearings 38 are formed respectively between the first side surface 21A of the support member 21 and the facing surface 41A of the flange 41, and between the second side surface 21B of the support member 21 and the facing surface 42A of the second flange 42. The gap (i.e., the third gap) G3 between the first side surface 21A of the support member 21 and the facing surface 41A of the first flange 41, and also the gap (i.e., the fourth gap) G4 between the second side surface 21B of the support member 21 and the facing surface 42A of the second flange 42 are kept substantially constant by the third gas bearings 38.

In the present embodiment, the second gap G2, the third gap G3, and the fourth gap G4 are each kept substantially constant by the second gas bearings 37 and the third gas bearings 38. In the present embodiment, movement of the shaft member 20 relative to the support member 21 in the X axial direction, the Y axial direction, the Z axial direction, the θY direction, and θZ direction is restricted by the second gas bearings 37 and the third gas bearings 38. The shaft member 20 is only able to move (i.e., is only able to rotate) relative to the support member 21 in the θX direction.

As is described above, in the present embodiment, the exposure apparatus EX is provided with a mask driving apparatus 2 which is able to rotate the mask holding member 1 which is holding the mask M in the θX direction taking the center axis J as the axis of rotation, and which is able to move the mask holding member 1 which is holding the mask M in the directions of the six degrees of freedom. The mask driving apparatus 2 includes a first driving mechanism 61 which is able to move the mask holding member 1 in at least a rotation direction (i.e., the θX direction), and with a second driving mechanism 62 which is able to move the shaft member 20 in a predetermined direction.

The first driving mechanism 61 has a rotor 61A which is mounted on the mask holding member 1 side and a stator 61B which is mounted on the shaft member 20 side, and moves the mask holding member 1 in at least a rotation direction (i.e., the θX direction). The first driving mechanism 61 includes a rotation motor which can be driven by means of Lorentz's force. In the present embodiment, the rotor 61A of the first driving mechanism 61 has a magnet unit, while the stator 61B has a coil unit.

In the present embodiment, the rotor 61A is mounted on a second surface 27B of the base material 27 of the mask holding member 1. The second surface 27B of the base material 27 is on the opposite side from the first surface 27A and faces the −X side. Moreover, in the present embodiment, the shaft member 20 has a third flange 43 which has a facing surface 43A which faces the second surface 27B of the base material 27, and the stator 61B is mounted on the facing surface 43A of the third flange 43. Both the second surface 27B and the facing surface 43A are substantially parallel with a YZ plane. A predetermined gap (i.e., a fifth gap) G5 is formed between the second surface 27B and the facing surface 43A.

The stator 61B includes a plurality of coils (i.e., a coil array) which are arranged on the facing surface 43A so as to surround the center axis J. The rotor 61A includes a plurality of magnets (i.e., a magnet array) which are arranged on the second surface 27B surrounding the center shaft J such that the polarities thereof in the same direction as the coil array direction are alternately different.

The control apparatus 6 supplies sinusoidal three-phase alternating current to the plurality of coils of the stator 61B. As a result of this, thrust force is generated in the coil array direction, namely, in a rotational direction (i.e., the θX direction) around the center axis J. By switching the coil to which the three-phase current is supplied in accordance with the relative positions of the coil array and the magnet array, the control apparatus 6 is able to continuously change the relative positions of the coil array and the magnet array in the coil array direction. As a result of the magnetic field which is formed by the magnet array of the rotor 61A changing in a sinusoidal shape in the coil array direction and in the coil array cycle, fixed thrust force is generated in the coil array direction when three-phase alternating current is applied to the coil array.

By controlling the first driving mechanism 61 which includes the rotor 61A and the stator 61B, the control apparatus 6 is able to rotate the mask holding member 1 in a rotational direction (i.e., the θX direction) around the center axis J. Moreover, by controlling the first driving mechanism 61, the control apparatus 6 is able to adjust the distance in the X axial direction between the rotor 61A and the stator 61B. By adjusting the power which is supplied to the coil of the stator 61B, for example, the control apparatus 6 is able to adjust the gap (i.e., the fifth gap) G5 in the X axial direction between the facing surface 43A of the third flange 43 of the shaft member 20 and the second surface 27B of the base material 27 of the mask holding member 1.

Namely, by controlling the first driving mechanism 61, the control apparatus 6 is able to move the mask holding member 1 (i.e., the base material 27) in the X axial direction relative to the shaft member 20 (i.e., the third flange 43), and is thereby able to adjust the position of the mask holding member 1 relative to the shaft member 20 in the X axial direction.

In this manner, in the present embodiment, the first driving mechanism 61 of the mask driving apparatus 2 is able to move the mask holding member 1 which is holding the mask M in a rotational direction (i.e., in the θX direction) around the center axis J, and is also able to move it in the direction of the center axis J (i.e., in the X axial direction).

The second driving mechanism 62 has rotors 62A which are mounted on the base member 23 (i.e., the support member 21) side and stators 62B which are mounted on the second base plate 8 side, and are capable of moving the base member 23 and the support member 21 which is integral with the base member 23 in a predetermined direction. The second driving mechanism 62 includes a voice coil motor which can be driven by means of Lorentz's force. In the present embodiment, the rotors 62A of the second driving mechanism 62 have a magnet unit, while the stators 62B have a coil unit.

In the present embodiment, the rotors 62A are mounted respectively at a plurality of predetermined positions on the base member 23. The stators 62B are mounted respectively at a plurality of predetermined positions on the second base plate 8 so as to correspond to the rotors 62A. In the present embodiment, the rotors 62A are mounted respectively in at least six locations on the base member 23, while the stators 62B are mounted in at least six locations on the second base plate 8 so as to correspond to each of the rotors 62A. Note that, in FIG. 6, two each of both the rotors 62A and the stators 62B which correspond to these rotors 62A are shown in the drawing, and the remaining rotors 62A and stators 62B have been omitted.

By controlling the second driving mechanism 62 which includes the plurality of stators 62A and rotors 62B, the control apparatus 6 is able to move the base member 23 and the support member 21 which is integral with the base member 23 in the directions of the six degrees of freedom, namely, the X axial direction, the Y axial direction, the Z axial direction, and the θX, the θY, and the θZ directions.

Moreover, as is described above, the shaft member 20 is only able to move (i.e., is only able to rotate) in the θX direction relative to the support member 21. Movement of the shaft member 20 in the X axial direction, the Y axial direction, the Z axial direction, and the θY and θZ directions relative to the support member 21 is restricted by the second gas bearings 37 and the third gas bearings 38. Accordingly, in conjunction with the movement of the base member 23 and the support member 21 in the X axial direction, the Y axial direction, the Z axial direction, and the θY, and θZ directions, the shaft member 20 also moves in the X axial direction, the Y axial direction, the Z axial direction, and the θY and θZ directions. In other words, the shaft member 20 and the support member 21 (i.e., the base member 23) move in conjunction with each other in the X axial direction, the Y axial direction, the Z axial direction, and the θY; and θZ directions.

By moving the support member 21 in a predetermined direction, the second driving mechanism 62 is able to move the support member 21 in the predetermined direction together with the shaft member 20. Accordingly, by controlling the second driving mechanism 62 such that it moves the support member 21, the control apparatus 6 is able to move the shaft member 20 together with the support member 21 in all directions other than the X direction, namely, in the X axial direction, the Y axial direction, the Z axial direction, and the θY, and θZ directions.

Moreover, as is described above, the mask holding member 1 is only able to move in the X axial direction and the θX direction relative to the shaft member 20. Movement of the mask holding member 1 in the Y axial direction, the Z axial direction, and the θY and θZ directions relative to the shaft member 20 is restricted by the first gas bearings 36. Accordingly, in conjunction with the movement of the shaft member 20 in the Y axial direction, the Z axial direction, and the θY and θZ directions, the mask holding member 1 also moves in the Y axial direction, the Z axial direction, and the θY and θ directions. In other words, the mask holding member 1 and the shaft member 20 move together with each other in the Y axial direction, the Z axial direction, and the θY and θZ directions.

Accordingly, as a result of the second driving mechanism 62 moving the support member 21 together with the shaft member 20 in the Y axial direction, the Z axial direction, and the θY and θZ directions, it is also able to move the mask holding member 1 together with the shaft member 20 in the Y axial direction, the Z axial direction, and the θY and θZ directions. Moreover, by moving the support member 21 together with the shaft member 20 using the second driving mechanism 62 while adjusting the fifth gap G5 (for example, maintaining this gap at a fixed value) using the first driving mechanism 61, the control apparatus 6 is able to move the mask holding member 1 and the shaft member 20 together with each other in the X axial direction, the Y axial direction, and the Z axial direction, and in the θY and θZ directions.

In addition, by controlling the mask driving apparatus 2 which includes the first driving mechanism 61 and the second driving mechanism 62, the control apparatus 6 is able to move the mask holding member 1 which is holding the mask M in the directions of the six degrees of freedom, namely, in the X axial direction, the Y axial direction, and the Z axial direction, and in the θX, the θY, and the θZ directions. By controlling the mask driving apparatus 2, the control apparatus 6 is able to adjust the position of the mask holding member 1 in the directions of the six degrees of freedom, and is therefore able to adjust the position in the directions of the six degrees of freedom of the mask M which is held on the mask holding member 1, and consequently of the patterns MP.

In the present embodiment, the mask driving apparatus 2 has a magnet unit and a coil unit which is driven by Lorentz's force, and the coil unit and magnet unit are driven in a state of non-contact with each other. As a result, it is possible to suppress the generation of any vibration which is caused by the mask driving apparatus 2 which is driving the mask holding member 1.

Moreover, in the present embodiment, the exposure apparatus EX is provided with the anti-vibration apparatus 24 which suppresses vibration which is created due to the movement of the mask holding member 1. Vibration which is created by the movement of the mask holding member 1 is suppressed by the anti-vibration apparatus 24. In the present embodiment, the anti-vibration apparatus 24 includes at least a portion of the second driving mechanism 62 which has an actuator which is able to be driven by Lorentz's force, and includes a damper structure such as an air mount or the like. As is described above, the second driving mechanism 62 is provided with a plurality of actuators which are able to adjust the position of the base member 23 (i.e., the support member 21) in the directions of the six degrees of freedom. By driving the actuator based on detection results from an acceleration sensor (not shown) (or from a displacement sensor), it is possible to suppress any vibration which is created by the movement in a predetermined direction (i.e., one of the directions of the six degrees of freedom) of the mask holding member 1. For example, the control apparatus 6 detects the rate of acceleration (or the displacement) of the second base plate 8 using an acceleration sensor (or a displacement sensor), and based on the detection results, controls the anti-vibration apparatus 24 such that vibration of the second base plate 8 which is created by the movement of the mask holding member 1 is suppressed. As a result, the control apparatus 6 is able to suppress excitation of the natural frequencies of the body BD, the projection optical system PL, and the like, and thereby suppress vibration.

Moreover, in the present embodiment, the anti-vibration apparatus 24 includes a countermass 46 which absorbs reaction force from the inertia force which is created by the rotation in the θX direction of the mask holding member 1. In the present embodiment, the countermass 46 includes the shaft member 20 and the weight member 22 which is connected to the shaft member 20. This weight member 22 has a function of maintaining the weight balance when the mask M is held on the mask holding member 1.

The countermass 46 which includes the shaft member 20 is rotated in the opposite direction from that of the mask M, in accordance with the law of conservation of momentum, due to the reaction force of the inertia force which is created by the rotation of the mask M. For example, when the mask holding member 1 which is holding the mask M is rotated in the +θX direction by the driving of the first driving mechanism 61 of the mask driving apparatus 2, the countermass 46 which includes the shaft member 20 which is in a non-contact state with the mask holding member 1 is rotated in the −θX direction. As a result, it is possible to suppress vibration which is excited when the mask holding member 1 and the mask M are rotated.

For example, when the first driving mechanism 61 is driven in order to rotate the mask holding member 1 which is holding the mask M, the countermass 46 rotates in the opposite direction from the rotation direction of the mask M and the mask holding member 1 by an amount obtained by dividing the imparted impulse by the mass of the countermass 46. The reaction force created by the driving in order to move (i.e., rotate) the mask holding member 1 holding the mask M, or by the driving in order to maintain the attitude of the mask holding member 1 holding the mask M after it has been moved (i.e., after it has been rotated) is counterbalanced by the movement (i.e., the rotation) of this countermass 46. Vibration which is generated as a result of the mask holding member 1 which is holding the mask M being rotated is absorbed by the action of the countermass 46, and it is possible to restrict this vibration being transmitted to the second base plate 8.

Note that in the present embodiment, driving force is generated by the physical interaction (i.e., electromagnetic interaction) between the rotor 61A and the stator 61B of the first driving mechanism 61, and drive force is generated as a result of the rotor 61A and the stator 61B being excited. In the present embodiment, the stator 61B is moved slightly in the opposite direction from the rotor 61A by Lorentz's force (i.e., electromagnetic force). In the present embodiment, the member having the greater amount of relative movement is referred to as the rotor, while the member having the lesser amount of relative movement is referred to as the stator.

Moreover, in the present embodiment, the exposure apparatus EX is provided with a holding mechanism 47 which holds the countermass 46 such that it is able to be displaced by a predetermined amount. The holding mechanism 41 holds the countermass 46 such that it can be displaced (such i.e., such that it can be rotated) by a predetermined amount, and suppresses any rotation of the countermass 46 which is greater than this predetermined amount. Moreover, the holding mechanism 47 which includes an actuator is able to adjust the position of the countermass 46.

In the present embodiment, the holding mechanism 47 includes an actuator such as a voice coil motor which can be driven by means of Lorentz's force. Specifically, the holding mechanism 47 has a rotor 47A which includes a magnet unit which is mounted on the shaft member 20 side, and a stator 47B which includes a coil unit which is mounted on the second base plate 8 side. The holding mechanism 47 includes what is known as a trim motor.

In the present embodiment, the shaft member 20 has a fourth flange 44 which is formed between the second flange 42 and the weight member 22. The rotor 47A is mounted on a bottom surface of the fourth flange 44 facing the top surface of the second base plate 8. The stator 47B is mounted on a predetermined position on the top surface of the second base plate 8 so as to face the rotor 47A. The holding mechanism 47 which includes the voice coil motor having the rotor 47A and the stator 47B is able to move (i.e., is able to rotate) the countermass 46 which includes the shaft member 20 in the θX direction. Namely, when electricity is supplied to the coil unit of the stator 47B, drive force in the θX direction acts on the rotor 47A which is mounted on the fourth flange 44.

As is described above, the countermass 46 is moved (i.e., is rotated) in the θX direction in the opposite direction from the mask holding member 1 by the reaction force created by the rotation of the mask holding member 1 holding the mask M. Here, for example, depending on the scanning exposure conditions, there is a possibility that the mask holding member 1 will continue to move solely in the +θX direction. In this case, there is a possibility that the countermass 46 will rotate considerably in the −θX direction from a reference position (i.e., an initial position or an intermediate position), and that this position will be considerably offset.

If the position in the θX direction of the shaft member 20 of the countermass 46 is considerably offset, then there is a possibility that this will have an adverse effect on controllability such as, for example, a deterioration in the controllability of the actuator (i.e., the voice coil motor) of the first driving mechanism 61 which is mounted on a portion of this shaft member 20.

Therefore, when the countermass 46 is rotated by greater than a predetermined amount from a reference position, in other words, when the relative positions in the X direction of the countermass 46 and the support member 21 (or alternatively, the holding member 1) are offset by more than an allowable value, the control apparatus 6 drives the voice coil motor of the holding mechanism 47, and adjusts (i.e., corrects) the position in the θX direction of the countermass 46 which includes the shaft member 20 such that, for example, it is restored to the reference position. Here, the driving of the voice coil motor of the holding mechanism 47 can be executed at predetermined timings outside an exposure operation such as, for example, when a substrate is being replaced, or after a first shot area has been exposed and before the subsequent second shot area is exposed.

Moreover, in the present embodiment, the holding mechanism 47 generates drive force and gently holds the countermass 46 such that the countermass 46 can be displaced by a predetermined amount even during a scanning exposure operation (i.e., even when the mask holding member 1 is being rotated by the first driving mechanism 61). In other words, even when the mask holding member 1 is being rotated by the first driving mechanism 61, the holding mechanism 47 generates drive force so that the countermass 46 is gently held within a range that enables any rotation of the countermass 46 greater than a predetermined amount to be suppressed.

If the holding mechanism 47 is not provided, and the countermass 46 rotates freely in the θX direction, then there is a possibility that it will no longer be possible to perform superior thrust control in the θX direction of the mask holding member 1 using the actuator of the first driving mechanism 61.

Therefore, in the present embodiment, even during a scanning operation (i.e., when the mask holding member 1 is being rotated by the first driving mechanism 61), as a result of the holding mechanism 47 gently holding the countermass 46 within a range that allows the countermass 46 to be displaced by a predetermined amount, the above described failures are prevented from occurring.

When scanning exposure commences, or during a calibration operation or the like, there are cases in which an operator wishes to place the position in the θX direction of the countermass 46 which includes the shaft member 20 at a reference position. In cases such as these, the control apparatus 6 is able to adjust the position in the θX direction of the countermass 46 using the actuator of the holding mechanism 47.

Figure 8A:
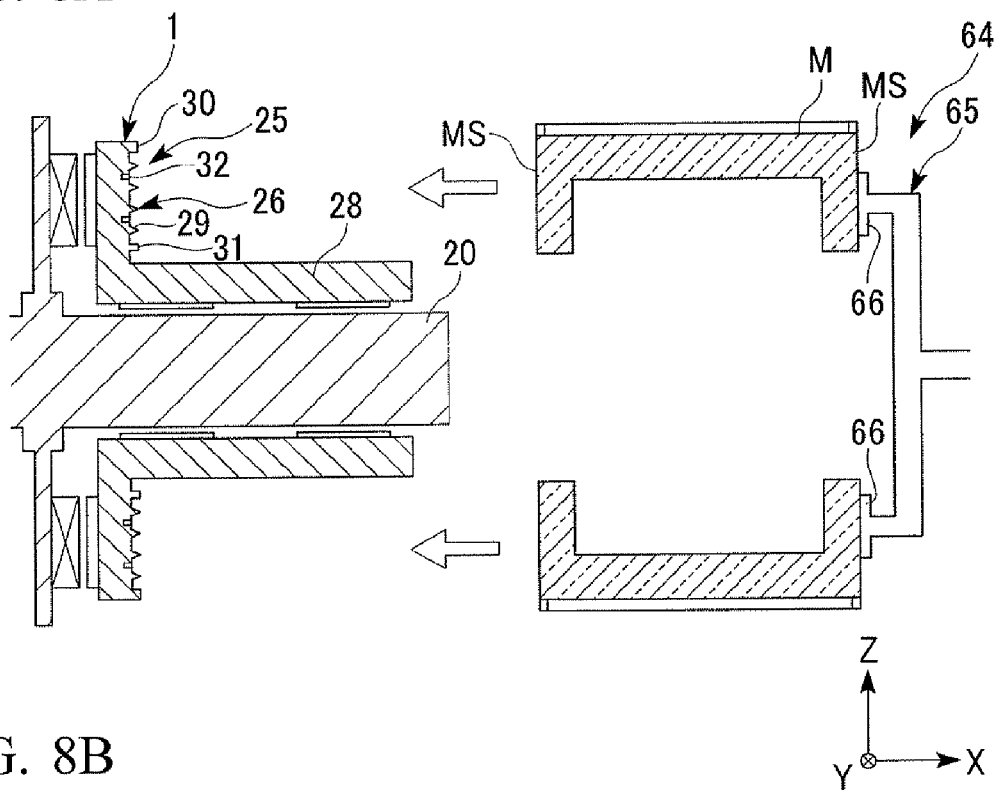
FIG. 8A is a view in order to illustrate a replacement system that replaces the mask according to the first embodiment, and shows a state in which a transporting apparatus is transporting a mask.
Figure 8B:
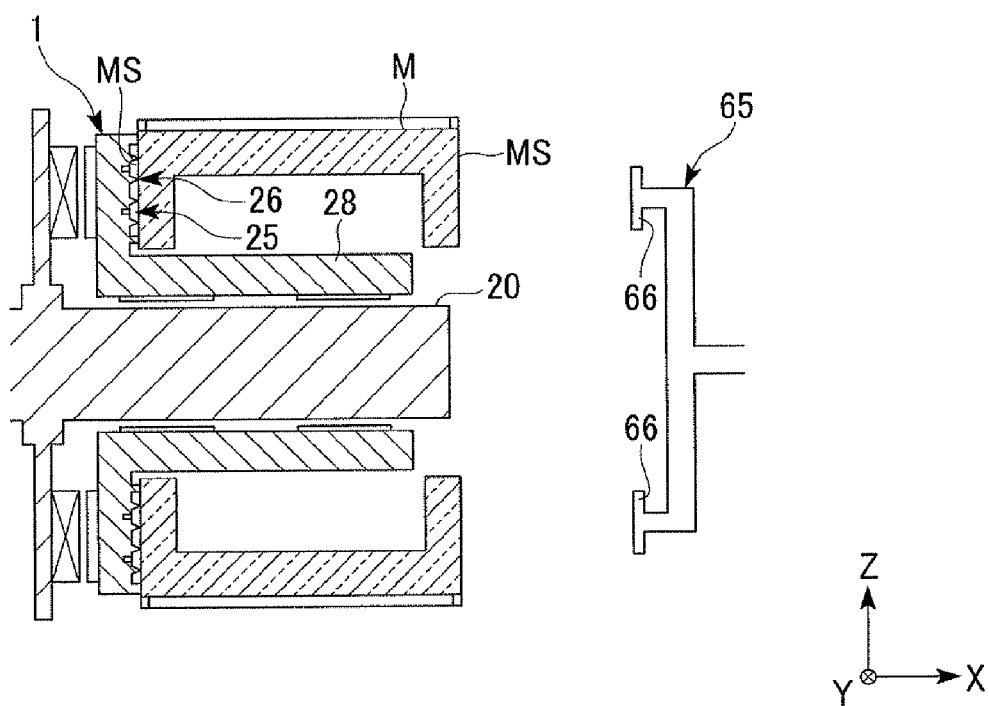
FIG. 8B is a view illustrating a replacement system that replaces the mask according to the first embodiment, and shows a state in which a mask is held on a mask holding member.

Next, a description will be given of a replacement system 64 which replaces the mask M. FIGS. 8A and 8B show the replacement system 64 which replaces the mask M. In FIGS. 8A and 8B, the exposure apparatus EX is provided with the replacement system 64 which replaces the mask M on the mask holding member 1. As is described above, the mask holding member 1 removably holds the mask M, and the control apparatus 6 is able to replace the mask M on the mask holding member 1 using the replacement system 64.

The replacement system 64 is provided on the mask holding member 1, and includes the suctioning mechanism 25 which removably suctions the mask M onto the holding surface 26, and a transport apparatus 65 which transports the mask M between the mask holding member 1 and a predetermined position (for example, a housing apparatus which is capable of housing the mask M).

In the present embodiment, the transporting apparatus 65 is provided with an arm member 66 which has a holding surface which uses suction to hold the side surface MS of the mask M on the +X side, which is on the opposite side from the side surface MS on the −X side which faces the holding surface 26 of the mask holding member 1. The transporting apparatus 65 is able to move while holding the side surface MS of the mask M using the armed member 66.

FIG. 8A shows a state in which the transporting apparatus 65 has mounted the mask M on the mask holding member 1 (i.e., shows a loaded state). As is shown in FIG. 8A, using the arm member 66, the transporting apparatus 65 loads (i.e., transports) the mask M onto the mask holding member 1 while holding the side surface MS on the +X side of the mask M, so that the mask M is inserted from one end side (i.e., the +X side) of the shaft member 20 onto the shaft member 20 and onto the protruding portion 28 of mask holding member 1. As is shown in FIG. 8B, the mask holding member 1 holds the side surface MS on the −X side of the mask M by means of the holding surface 26 using suction. After the mask holding member 1 is holding the mask M, the arm member 66 of the transporting apparatus 65 is withdrawn from the mask M which is now held on the mask holding member 1.

Moreover, when the mask M which is being held on the mask holding member 1 is unloaded (i.e., transported away) from the mask holding member 1, the armed member 66 of the transporting apparatus 65 approaches the side surface MS on the +X side of the mask M which is being held on the mask holding member 1 from the one end side (i.e., the +X side) of the shaft member 20, and holds the side surface MS on the +X side of the mask M using suction. When the arm member 66 holds the mask M, the holding of the mask M by the mask holding member 1 is released. The arm member 66 of the transporting apparatus 65 moves to the +X side while holding the mask M such that the mask M is withdrawn from the shaft member 20 and from the protruding portion 28 of the mask holding member 1. As a result, the mask M is removed from the mask holding member 1 by the transporting apparatus 65.

In this manner, the replacement system 64 which includes the transporting apparatus 65 and the suctioning mechanism 25 is able to perform at least one of transporting the mask M onto the mask holding member 1 and transporting the mask M away from the mask holding member 1 from the direction of the one end side (i.e., the +X side) of the shaft member 20 such that the mask M can be inserted onto or be withdrawn from at least a portion of the shaft member 20 and the mask holding member 1.

Figure 9:
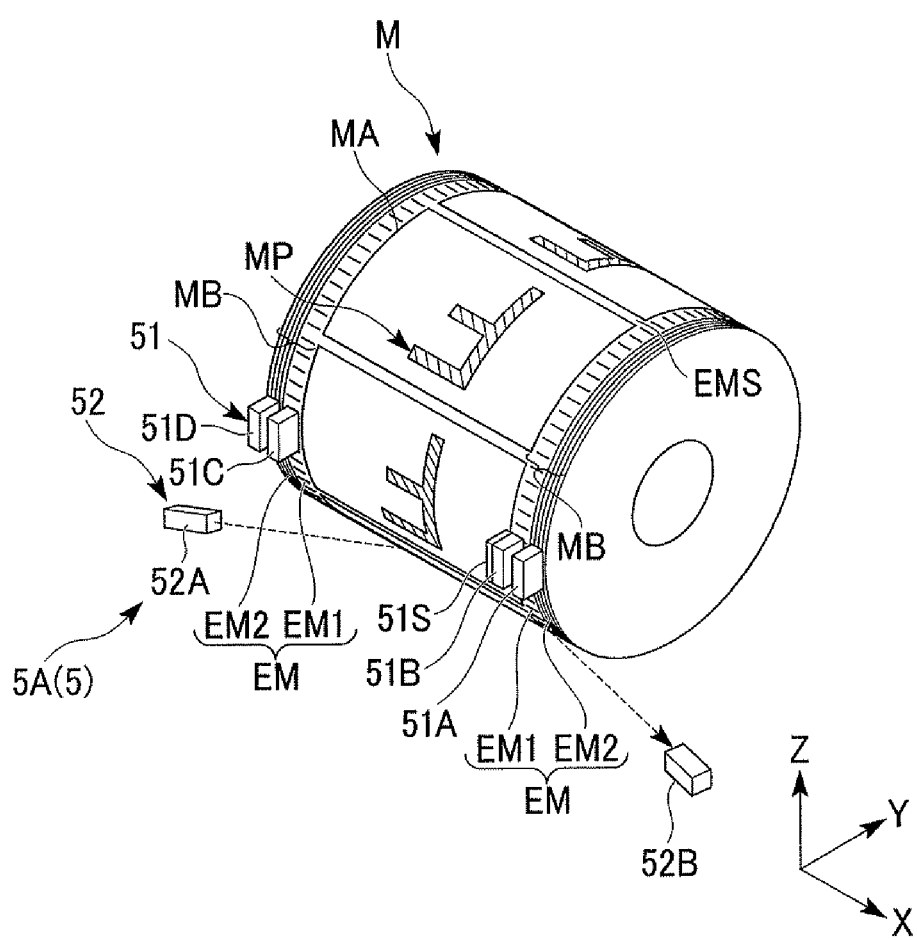
FIG. 9 is a typical view in order to illustrate a first detection system which is able to acquire position information about the mask according to the first embodiment.

Next, a description will be given of the first detection system 5A which is capable of acquiring position information for the mask M. FIG. 9 is a typical view illustrating the first detection system 5A. The first detection system 5A detects light via the mask M, and based on these detection results, is able to acquire position information for the mask M, and, consequently, position information relating to the patterns MP. In the present embodiment, the first detection system 5A includes an encoder system 51, and a focus and leveling detection system 52. The first detection system 5A which includes the encoder system 51 and the focus and leveling detection system 52 is able to acquire position information for the mask M (i.e., the patterns MP) in the directions of the six degrees of freedom, namely, the X axial direction, the Y axial direction, the Z axial direction, and the θX, θY, and θZ directions.

The encoder system 51 is able to acquire at least one of position information for the patterns MP of the mask M in the circumferential direction of the outer circumferential surface (i.e., the pattern formation surface) MF, and position information for the patterns MP of the mask M in the direction of the center axis J (i.e., in the X axial direction). The encoder system 51 is able to detect the rotation amount (i.e., the angle of rotation) of the mask M. The focus and leveling detection system 52 is able to acquire at least position information for the pattern formation surface MS of the mask M in a direction which is perpendicular to the center axis J (i.e., in the Z axial direction).

The encoder system 51 of the first detection system 5A detects light in mark formation areas MB of the outer circumferential surface MF via position detection marks which are formed in a predetermined positional relationship relative to the patterns MP, and based on these detection results, acquires position information relating to the patterns MP. The encoder system 51 includes an optical encoder.

Figure 10A:
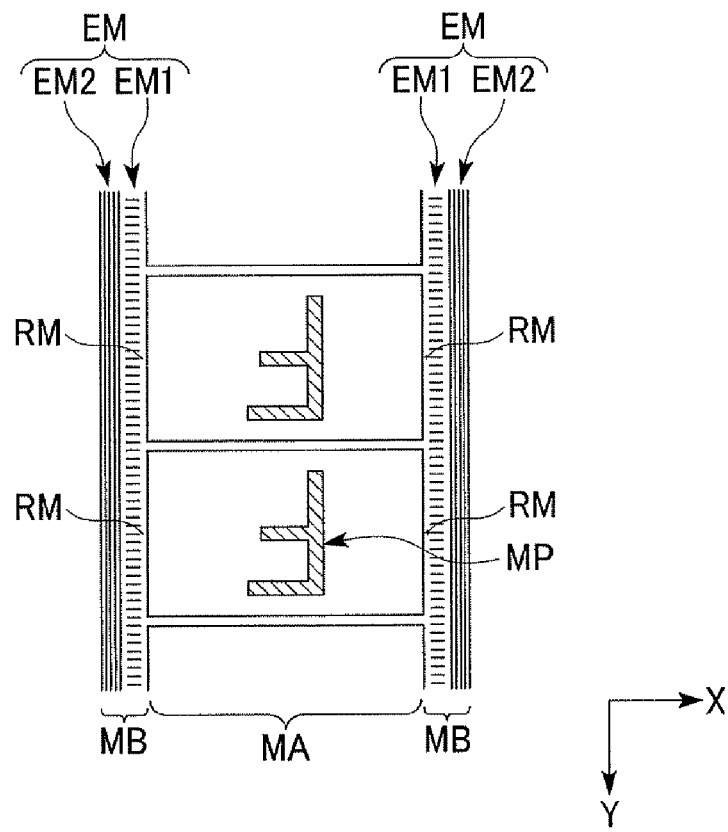
FIG. 10A is a typical view in order to illustrate a mark formation area of the mask according to the first embodiment, and shows a portion of a pattern formation surface of a mask which has been unrolled along an XY plane.
Figure 10B:
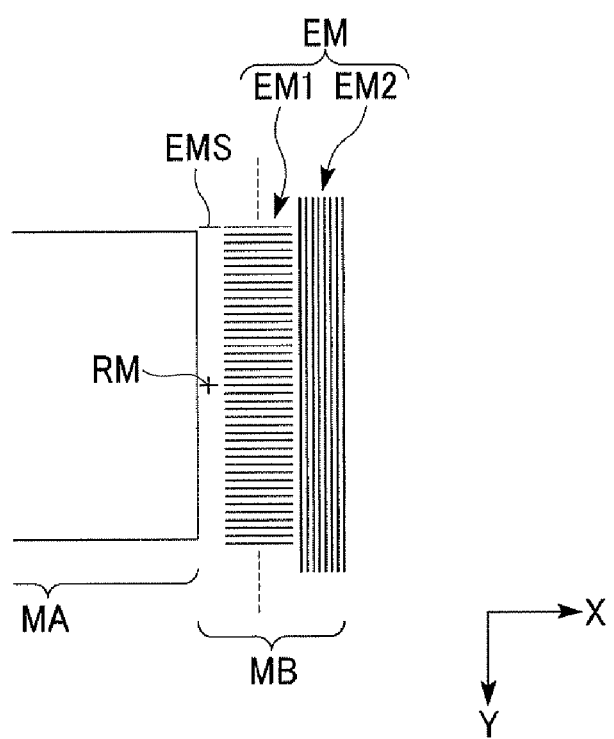
FIG. 10B is a typical view in order to illustrate a mark formation area of the mask according to the first embodiment, and is an enlarged view of a part of the mark formation area shown in FIG. 10A.

FIG. 10A shows a portion of the outer circumferential surface of the mask M unrolled along an XY plane, while FIG. 10B is an enlarged view of a portion of a mark formation area MB shown in FIG. 10A. As is shown in FIGS. 10A and 10B, the mask M is provided with marks EM and RM which are formed in predetermined positional relationships relative to the patterns MP in the mark formation areas MB of the outer circumferential surface MF, and which are used to acquire position in formation relating to the patterns MP.

The mark formation areas MB are placed on the outer side of the pattern formation area MA on both the one end side (i.e., the +Z side) and the other end side (i.e., the −X side) in the direction of the center axis J (i.e., in the X axial direction) of the outer circumferential surface MF of the mask M. The pattern formation area MA where the patterns MP are formed is placed continuously in the circumferential direction of the outer circumferential surface MF so as to encircle the center axis J. The mark formation areas MB are placed continuously in the circumferential direction of the outer circumferential surface MF so as to encircle the center axis J, and so as to correspond to the pattern formation areas MA.

The marks which are formed in the mark formation areas MB include position detection marks EM which are detected by the encoder system 51, and alignment marks RM which are detected by the light receiving device 56 which is placed on the image plane side (i.e., the light emitting surface side) of the projection optical system PL. In the present embodiment, the detection system 5 includes the light receiving device 56.

The position detection marks EM which are detected by the encoder system 51 are marks that are used in order to acquire at least one of position information for the patterns MP in the circumferential direction (i.e., in the θX direction) of the outer circumferential surface MF, and position information for the patterns MP in the direction of the center axis J (i.e., in the X axial direction). The control apparatus 6 detects light via the position detection marks EM using the encoder system 51, and is able to acquire at least one of position information for the patterns MP in the circumferential direction of the outer circumferential surface MF, and position information for the patterns MP in the direction of the center axis J.

The alignment marks RM which are detected by the light receiving device 56 are marks which are used to acquire information relating to the positional relationship between images of the patterns MP obtained via the projection optical system PL, and the shot areas S on the substrate P which is placed on the image plane side (i.e., on the light emitting surface side) of the projection optical system PL. The control apparatus 6 detects light via the alignment marks RM using the light receiving device 56, and is able to acquire information relating to the positional relationship between the images of the patterns MP and the shot areas S.

The position detection marks EM which are detected by the encoder system 51 are formed continuously in the circumferential direction on the outer circumferential surface MF. The alignment marks RM which are detected by the light receiving device 56 are formed intermittently in the circumferential direction on the outer circumferential surface MF. A plurality of both the marks EM and the marks RM are formed respectively. The marks EM and the marks RM are formed so as to correspond respectively to the plurality of patterns MP.

The position detection marks EM which are detected by the encoder system 51 include a line pattern (i.e., a line and space pattern) of which a plurality are formed extending in a pre-determined direction. As is shown in FIG. 10B, the position detection marks EM include a plurality of line patterns whose longitudinal direction is the X axial direction and which are arranged at a predetermined pitch in the circumferential direction (i.e., the θX direction) of the outer circumferential surface MF, and a plurality of line patterns whose longitudinal direction is the θX direction (i.e., the Y axial direction in the unrolled state shown in FIGS. 10A and 10B) and which are arranged at a predetermined pitch in the X axial direction. These line patterns function as a scale (i.e., a diffraction grating) which is detected by the encoder system 15.

In the description given below, the mark group (i.e., the line group) which includes the plurality of line patterns whose longitudinal direction is the X axial direction and which are arranged at a predetermined pitch in the circumferential direction (i.e., the θX direction) of the outer circumferential surface MF are referred to where appropriate as the first marks EM1, while the mark group (i.e., the line group) which includes the plurality of line patterns whose longitudinal direction is the θX direction and which are arranged at a predetermined pitch in the X axial direction are referred to where appropriate as the second marks EM2.

The first marks EM1 include a plurality of line patterns which are arranged at a predetermined pitch in the circumferential direction of the outer circumferential surface MF so as to encircle the center axis J. The second marks EM2 include a plurality of line patterns which are arranged at a predetermined pitch in the X axial direction and which extend in the circumferential direction of the outer circumferential surface MF so as to encircle the center axis J. The first marks EM1 and the second marks EM2 are each formed in the two mark formation areas MB on both sides of the pattern formation area MA.

As is shown in FIG. 9, the encoder systems 51 are positioned so as to correspond to each of the first marks EM1 and the second marks EM2. In the present embodiment, the encoder systems 51 are provided with a first encoder 51A which detects the second marks EM2 on the mark formation area MB on the +X side, a second encoder 51B which detects the first marks EM1 on the mark formation area on the +X side, a third encoder 51C which detects the first marks EM1 on the mark formation area on the −X side, and a fourth encoder 51D which detects the second marks EM2 on the mark formation area MB on the −X side. These first, second, third, and fourth encoders 51A, 51B, 51C, and 51D are optical encoders.

Both the first encoder 51A and the fourth encoder 51D are able to detect position information for the mask M in the direction of the center axis J (i.e., in the X axial direction), and consequently, position information for the patterns MP by detecting the second marks EM2. Both the second encoder 51B and the third encoder 51C are able to detect position information for the mask M in the circumferential direction of the outer circumferential surface MF (i.e., in the θX direction) by detecting the first marks EM1.

Detection results from the first, second, third, and fourth encoders 51A, 51B, 51C, and 51D are output to the control apparatus 6. Based on the detection results from the respective encoders 51A, 51B, 51C, and 51D, the control apparatus 6 is able to acquire position information for the patterns MP of the mask M. In the present embodiment, the control apparatus 6 is able to acquire position information in the X axial direction of the patterns MP when the outer circumferential surface MF has been unrolled along an XY plane based on detection results from at least one of the first encoder 51A and the fourth encoder 51D. Moreover, the control apparatus 6 is able to acquire position information in the Y axial direction (namely, in the circumferential direction of the outer circumferential surface MF) for the patterns MP when the outer circumferential surface MF has been unrolled along an XY plane based on detection results from at least one of the second encoder 51B and the third encoder 51C. In addition, the control apparatus 6 is able to acquire position information in the θZ direction for the patterns MP when the outer circumferential surface MF has been unrolled along an XY plane based on detection results from both the second encoder 51B and the third encoder 51C.

Figure 11:
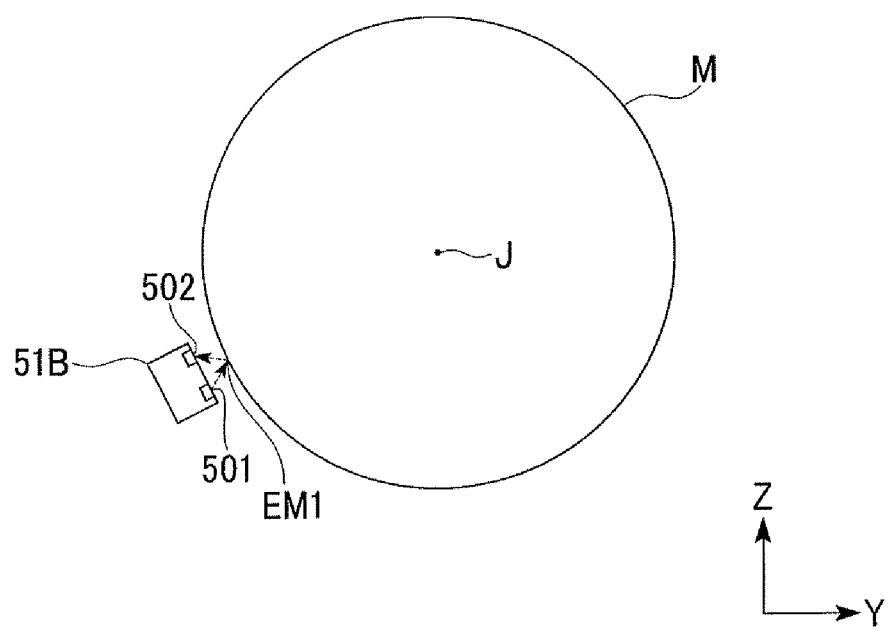
FIG. 11 is a typical view showing an example of an encoder system according to the first embodiment.

FIG. 11 is a typical view showing the second encoder 51B. The second encoder 51B is provided with a light projection device 501 which projects detection light onto the mark formation areas MB where the first marks EM1 are formed, and with a light receiving device 502 which is capable of receiving detection light that has been projected onto the mask formation areas MB of the mask M via these mask formation areas MB of the mask M. In the present embodiment, the second encoder 51B employs the light receiving device 502 in order to receive detection light which has been projected from the light projection device 501 onto the mark formation areas MB, and has then been reflected by this mark formation areas MB. The second encoder 51B projects laser light onto the first marks EM1 (i.e., a diffraction grating) using the light projection device 501, and detects the first marks EM1 by means of an interference phenomenon which uses this laser light.

Each line pattern of the first marks EM1 is formed at a predetermined pitch, and when the mask M is rotated, the line portions and the non-line portions are formed alternatingly on the irradiation area of the detection light which is projected from the light projection device 501, so that the light receiving state of the light receiving device 502 changes. As a result, based on the light reception results from the light receiving device 502, the second encoder 51B is able to determine the position in the rotation direction (i.e., the rotation amount and the rotation angle) of the mask M.

A plurality of light emitting elements are provided in the light projection device 501. By forming the irradiation areas of the detection light emitted from each of these light emitting elements at predetermined intervals (for example, approximately ¼ the pitch of each line pattern) in the circumferential direction of the mark formation areas MB, and by providing a plurality of light receiving elements in the light receiving device 502 such that they correspond to the respective light emitting elements (i.e., to the irradiation area), the second encoder 51B is able to detect the rotation direction of the mask M based on the light reception results from the respective light receiving elements.

The second encoder 51B is also able to detect the rotation speed of the mask M based on the number of line patterns which are detected per unit time, and the pitch of the line patterns which is a known value.

Note that, in the description which uses FIG. 11, the second encoder 51B and the first marks EM1 which correspond to this second encoder 51B are used as an example, however, in addition to the second encoder 51B, the other encoders 51A, 51C, and 51D and the respective marks EM1 and EM2 which correspond to these encoders 51A, 51C, and 51D have the same structures.

Moreover, in the present embodiment, in synchronization with the movement of the substrate P in a predetermined one-dimensional direction (i.e., in the Y axial direction), images of the plurality of patterns MP are sequentially formed on the substrate P while the outer circumferential surface MF of the mask M is being rotated with the center axis J taken as the axis of rotation. In addition, in the present embodiment, the mask M is provided with a mark EMS which is used to acquire information relating to the rotation start position when the outer circumferential surface MF rotates in synchronization with the movement of the substrate P. In the description below, the mark EMS which is used to acquire information relating to the rotation start position when the outer circumferential surface MF rotates in synchronization with the movement of the substrate P is referred to when appropriate as a rotation start position mark EMS.

Figure 12:
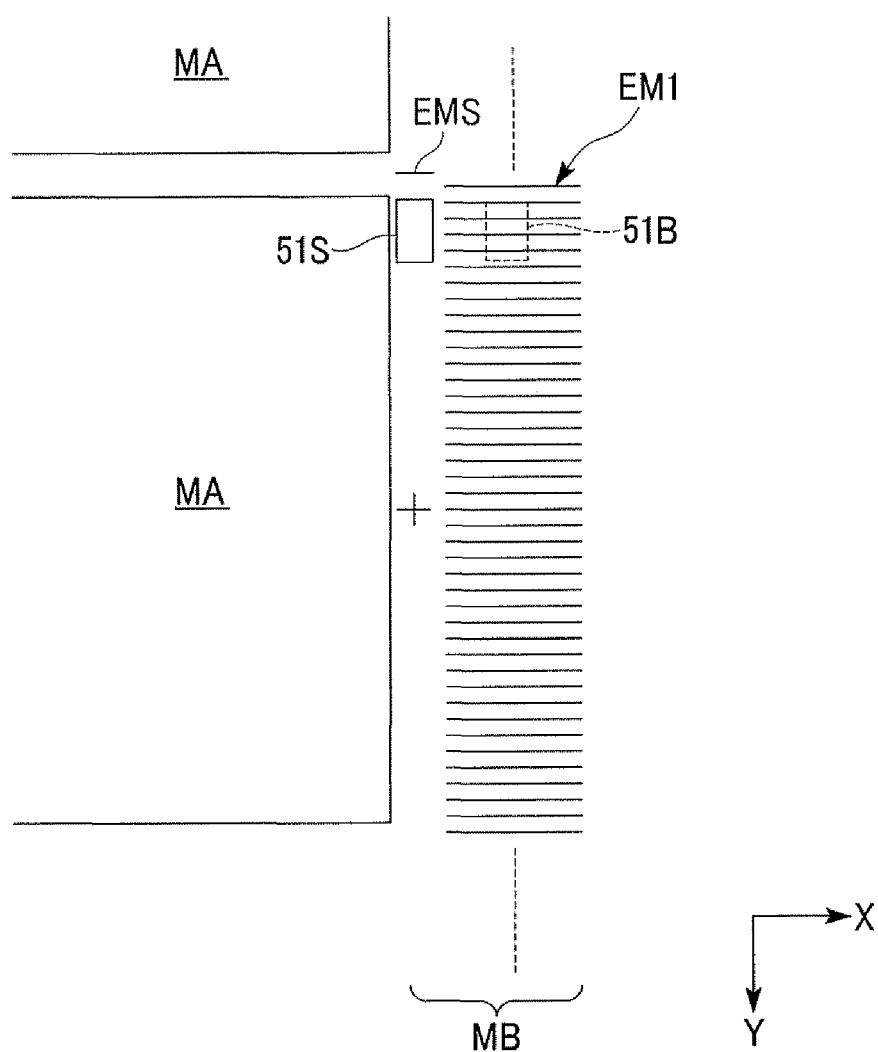
FIG. 12 is a view showing unrolled along an XY plane the vicinity of a mask pattern formation surface on which are formed rotation start position marks according to the first embodiment.

FIG. 12 shows the vicinity of the outer circumferential surface MF of the mask M on which the rotation start position mark EMS is formed unrolled along an XY plane. As is shown in FIG. 12 and FIG. 10B, the rotation start position mark EMS is formed on a mark formation area MB of the mask M. The rotation start position mark EMS is formed in one location in the circumferential direction of the outer circumferential surface MF of the mask M.

As is shown in FIG. 12 and FIG. 9, the encoder system 51 of the first detection system 5A is provided with a fifth encoder 51S which detects the rotation start position mark EMS. The fifth encoder 51S has the same structure as the first through fourth encoders 51A through 51D, and is provided with a light projection device which projects detection light onto the mark formation areas MB where the rotation start position mark EMS is formed, and with a light receiving device which is capable of receiving detection light that has been projected onto the mask formation areas MB of the mask M via this mask formation areas MB of the mask M.

When the mask M is rotated so that the rotation start position mark is located on the irradiation area of the detection light which is irradiated from the light projection device of the fifth encoder 51S, the light receiving state of the light receiving device changes. As a result, based on the light reception result from the light receiving device, the fifth encoder 51S is able to detect the rotation start position of the mask M when the mask M is rotated in synchronization with the movement of the substrate P.

In this manner, the first detection system 5A detects detection light via the rotation start position mark EMS, and is able to acquire information relating to the rotation start position when the mask M is rotated in synchronization with the movement of the substrate P. Based on the detection results from the first detection system 5A which includes the fifth encoder 51, the control apparatus 6 controls the mask driving apparatus 2 and is able to set the position of the mask M which is held on the mask holding member 1 to the rotation start position when the mask M is rotated in synchronization with the movement of the substrate P.

In the present embodiment, the rotation start position mark EMS functions as a reference position (i.e., a reference mark) when the encoder system 51 detects the position of the mask M in the rotation direction.

The focus and leveling detection system 52 of the first detection system 5A is able to acquire position information for the pattern formation surface MF of the mask M in a direction which is perpendicular to the center axis J (i.e., in the Z axial direction). The focus and leveling detection system 52 is able to acquire position information in an area of the pattern formation surface MF of the mask M where the exposure light EL is irradiated by the illumination system IL (namely, the illumination area IA). As is described above, in the present embodiment, the bottommost portion BT of the pattern formation surface MF of the mask M is illuminated by the exposure light EL, and the focus and leveling detection system 52 acquires position information for this bottommost portion BT.

In the present embodiment, the focus and leveling detection system 52 which is used to acquire position information for the mask M includes a grazing incidence type of focus and leveling detection system. As is shown in FIG. 9, the focus and leveling detection system 52 has a light projection device 52A which projects detection light from an oblique direction onto the pattern formation surface MF of the mask M, and a light receiving device 52B which is capable of receiving detection light which has been projected onto the pattern formation surface MF of the mask M and reflected by this pattern formation surface MF of the mask M.

Moreover, in the present embodiment, as is described, for example, in Japanese Patent Application Publication No. H11-045846 A, the focus and leveling detection system 52 has the light projection device 52A which is capable of projecting a plurality of detection lights (i.e., light flux), and is able to irradiate detection light onto each one of a plurality of predetermined positions on the pattern formation surface MF of the mask M. In the present embodiment, using the projection optical device 52A, the focus and leveling detection system 52 projects detection light onto each one of a plurality of predetermined positions in the vicinity of the bottommost portion BT of the pattern formation surface MF of the mask M.

The focus and leveling detection system 52 irradiates detection light emitted by the light projection device 52A onto the pattern formation surface MF of the mask M, and detects the detection light from the pattern formation surface MF using the light receiving device 52B. Based on these detection results, the focus and leveling detection system 52 then acquires surface position information for the pattern formation surface MF.

Detection results (i.e., the light reception results from the light receiving device 52B) from the focus and leveling detection system 52 are output to the control apparatus 6. The control apparatus 6 is able to acquire position information for the patterns MP on the mask M (i.e., position information for the pattern formation surface MF on which the patterns MP are formed) based on the light reception results from the light receiving device 52B. In the present embodiment, based on the light reception results from the light receiving device 52B which has received the detection light irradiated onto the bottommost portion BT of the pattern formation surface MF (or onto the vicinity thereof), the control apparatus 6 is able to acquire position information in the Z axial direction for the patterns MP when the pattern formation surface MF has been unrolled along an XY plane. In addition, based on the light reception results from the light receiving device 52B which has received each of the plurality of detection lights irradiated onto each of the plurality of predetermined positions of a predetermined area which includes the bottommost portion BT of the pattern formation surface MF (or the vicinity thereof), the control apparatus 6 is able to acquire position information in the θX direction and position information in the θY direction for the patterns MP when the pattern formation surface MF has been unrolled along an XY plane.

In this manner, in the present embodiment, based on the detection results from the encoder system 51, the control apparatus 6 is able to acquire position information in the X axial direction, the Y axial direction, and the θZ direction for the patterns MP when the pattern formation surface MF has been unrolled along an XY plane, and based on detection results from the focus and leveling detection system 52, the control apparatus 6 is able to acquire position information in the Z axial direction, and the θX and θY directions for the patterns MP when the pattern formation surface MF has been unrolled along an XY plane. Namely, in the present embodiment, the first detection system 5A which includes the encoder system 51 and the focus and leveling detection system 52 is able to acquire position information in the directions of the six degrees of freedom, namely, the X axial direction, the Y axial direction, and the Z axial direction, and the θX, θY, and θZ directions for the patterns MP.

Figure 13:
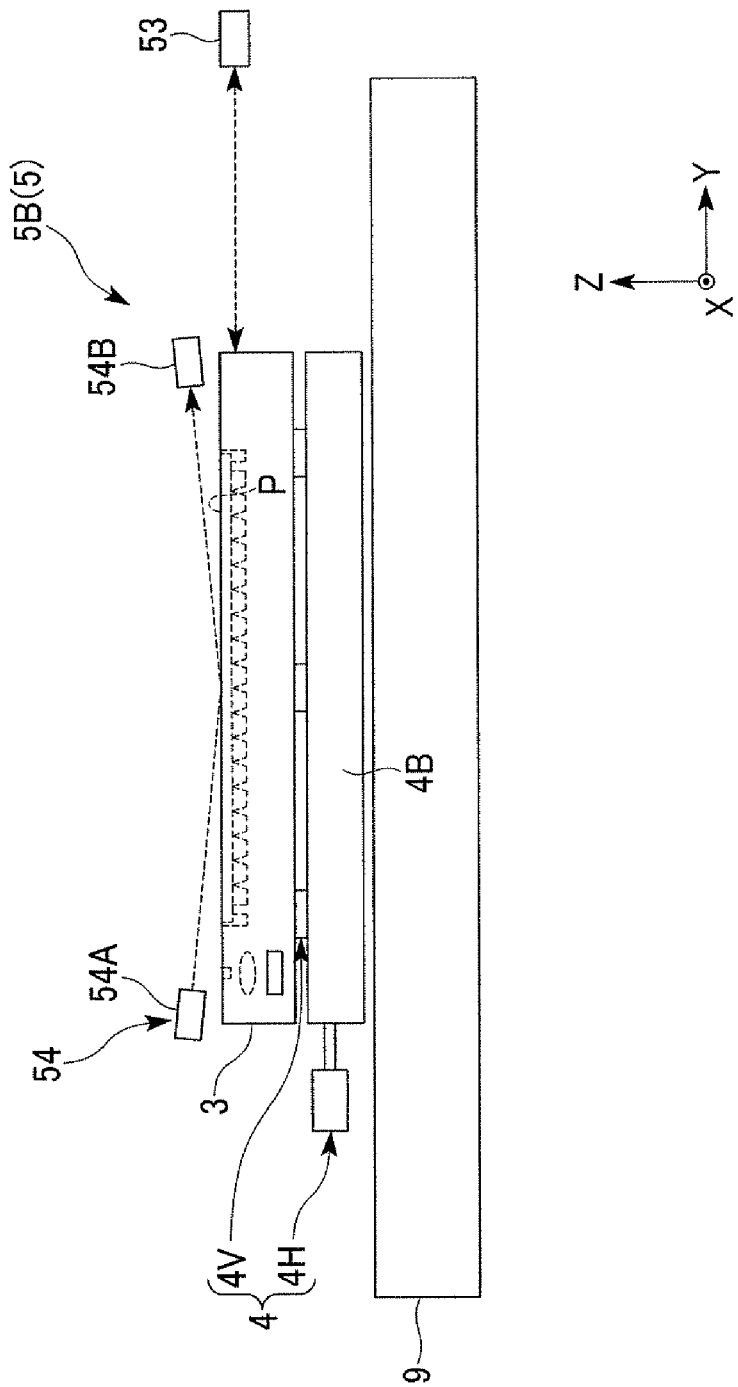
FIG. 13 is a typical view in order to illustrate a second detection system which is able to acquire position information about the substrate according to the first embodiment.

Next, a description will be given of the substrate holding member 3 and the substrate driving apparatus 4. FIG. 13 shows the vicinity of the substrate holding member 3 and the substrate driving apparatus 4. The substrate driving apparatus 4 is provided with a first drive system 4H which, by moving a base member 4B which is supported in a non-contact state on the top surface of the third base plate 9 by air bearings in the X axial direction, the Y axial direction, and the θZ direction of this third base plate 9, is able to move the substrate holding member 3 which is mounted on this base member 4B in the X axial direction, the Y axial direction, and the θZ direction, and with a second drive system 4V which is able to move the substrate holding member 3 in the Z axial direction, the θX direction, and the θY direction relative to the base member 4B.

The first drive system 4H includes an actuator such as, for example, a linear motor, and is able to drive the base member 4 which is supported in a non-contact state on the third base plate 9 in the X axial direction, the Y axial direction, and the θZ direction. The second drive system 4V includes an actuator such as, for example, a voice coil motor which is provided between the base member 4B and the substrate holding member 3, and a measuring device (such as an encoder or the like) (not shown) which measures the drive amount of the respective actuators. As is shown in FIG. 13, the substrate holding member 3 is supported on the base member 4B by at least three actuators. Each of these actuators is able to drive the substrate holding member 3 independently in the Z axial direction relative to the base member 4B. The control apparatus 6 drives the substrate holding member 3 in the Z axial direction, and the θX and θY directions relative to the base member 4B by adjusting the drive amount of each of these three actuators.

In this manner, the substrate driving apparatus 4 which includes the first and second drive systems 4H and 4V is able to drive the substrate holding member 3 in the directions of the six degrees of freedom, namely, in the X axial direction, the Y axial direction, and the Z axial direction, and in the θX, θY, and θZ directions. By controlling the substrate driving apparatus 4, the control apparatus 6 is able to control the position in the directions of the six degrees of freedom namely, the X axial direction, the Y axial direction, and the Z axial direction, and the θX, θY, and θZ directions of the surface of the substrate P which is held on the substrate holding member 3.

Next, a second detection system 5B which is able to acquire position information for the substrate P will be described. In FIG. 13, the second detection system 5B includes a laser interferometer system 53 which is able to acquire position information relating to the X axial direction, the Y axial direction, and the θZ direction for the substrate holding member 3 (and consequently for the substrate P) using measuring mirrors which are provided on the substrate holding member 3, and the focus and leveling detection system 54 which is able to acquire surface position information (i.e., position information for the X axial direction, and the θX and θY directions) for the surface of the substrate P which is being held on the substrate holding member 3. The focus and leveling detection system 54 includes a grazing incidence type of focus and leveling detection system such as that disclosed, for example, in Japanese Patent Application Publication No. H08-37149 A (corresponding to U.S. Pat. No. 6,327,025), and has a light projection device 54A which projects detection light from an oblique direction onto the surface of the substrate P, and a light receiving device 54B which is capable of receiving detection light which has been projected onto the surface of the substrate P and reflected by this surface of the substrate P. Note that the focus and leveling detection system 54 which is employed may also be one which uses electrostatic capacity sensors. The control apparatus 6 controls the position of the substrate P which is being held on the substrate holding member 3 by driving the substrate driving apparatus 4 based on detection results from the second detection system 5B which includes the laser interferometer system 53 and the focus and leveling detection system 54.

In this manner, in the present embodiment, based on detection results from the laser interferometer system 53, the control apparatus 6 is able to acquire position information in the X axial direction, the Y axial direction, and the θZ direction for the surface of the substrate P, and based on detection results from the focusing and leveling detection system 52, the control apparatus 6 is able to acquire position information in the Z axial direction and the θX and θY directions for surface of the substrate P. Namely, in the present embodiment, the second detection system 5B which includes the laser interferometer system 53 and the focus and leveling detection system 54 is able to acquire position information in the directions of the six degrees of freedom, namely, in the X axial direction, the Y axial direction, and the Z axial direction and in the θX, θY, and θZ directions for the substrate P.

Figure 14:
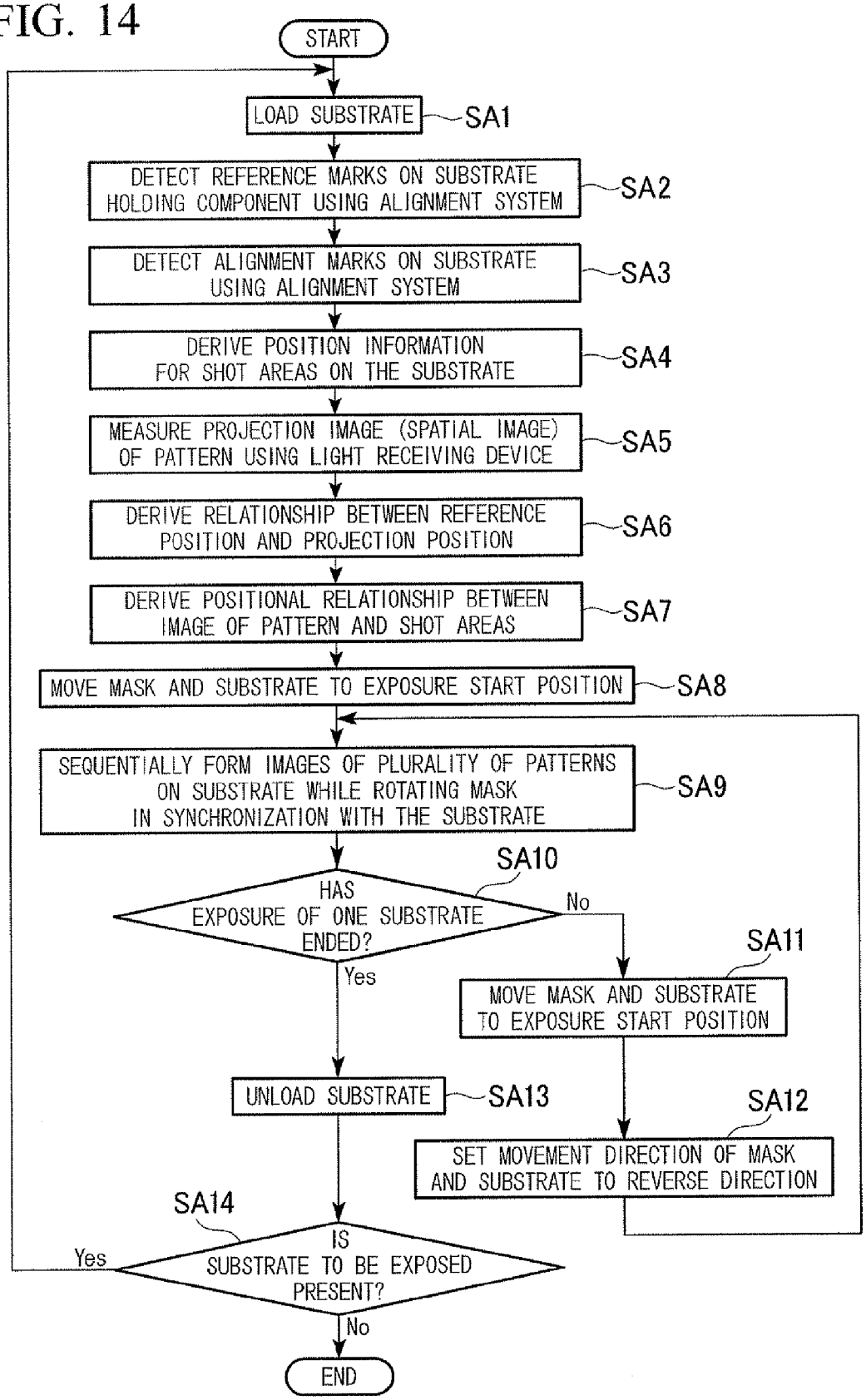
FIG. 14 is a flowchart in order to illustrate an example of an exposure method according to the first embodiment.
Figure 15:
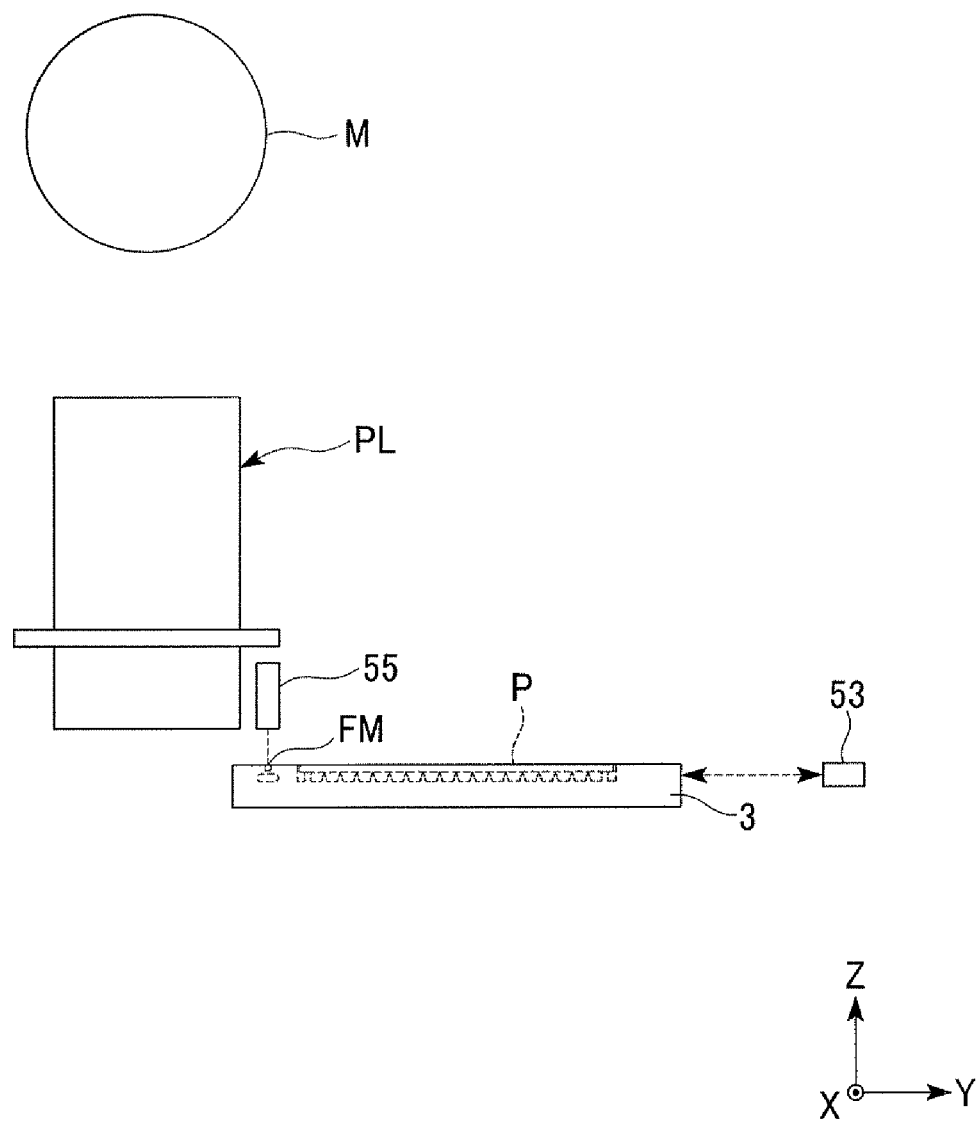
FIG. 15 is a typical view in order to illustrate an example of an operation of an exposure apparatus according to the first embodiment.

Next, a method of exposing the substrate P using the exposure apparatus EX having the above described structure will be described using the flowchart shown in FIG. 14, and the typical views shown in FIGS. 15, 16, and 17.

When an exposure sequence is started, and a mask M is loaded onto the mask holding member 1, and a substrate P is loaded onto the substrate holding member 3 (i.e., step SA1), the control apparatus 6 starts predetermined measurement processing. For example, the control apparatus 6 starts measurement processing for the substrate holding member 3 which is holding the substrate P.

In the present embodiment, a detection operation which employs the alignment system 55 is included in the measurement processing. The control apparatus 6 moves the substrate holding member 3 which is holding the substrate P in an XY direction using the substrate driving apparatus 4, and as is shown in FIG. 15, a reference mark FM is placed on the substrate holding member 3 in the detection area of the alignment system 55. The control apparatus 6 detects the reference mark FM which is provided on the substrate holding member 3 using the alignment system 55, while measuring the position information in the X axial direction and the Y axial direction of the substrate holding member 3 using the laser interferometer system 53 (step SA2).

As a result, the control apparatus 6 is able to determine position information in the X axial direction and the Y axial direction for the reference mark FM on the substrate holding member 3 within a coordinate system which is prescribed by the laser interferometer system 53.

Figure 16:
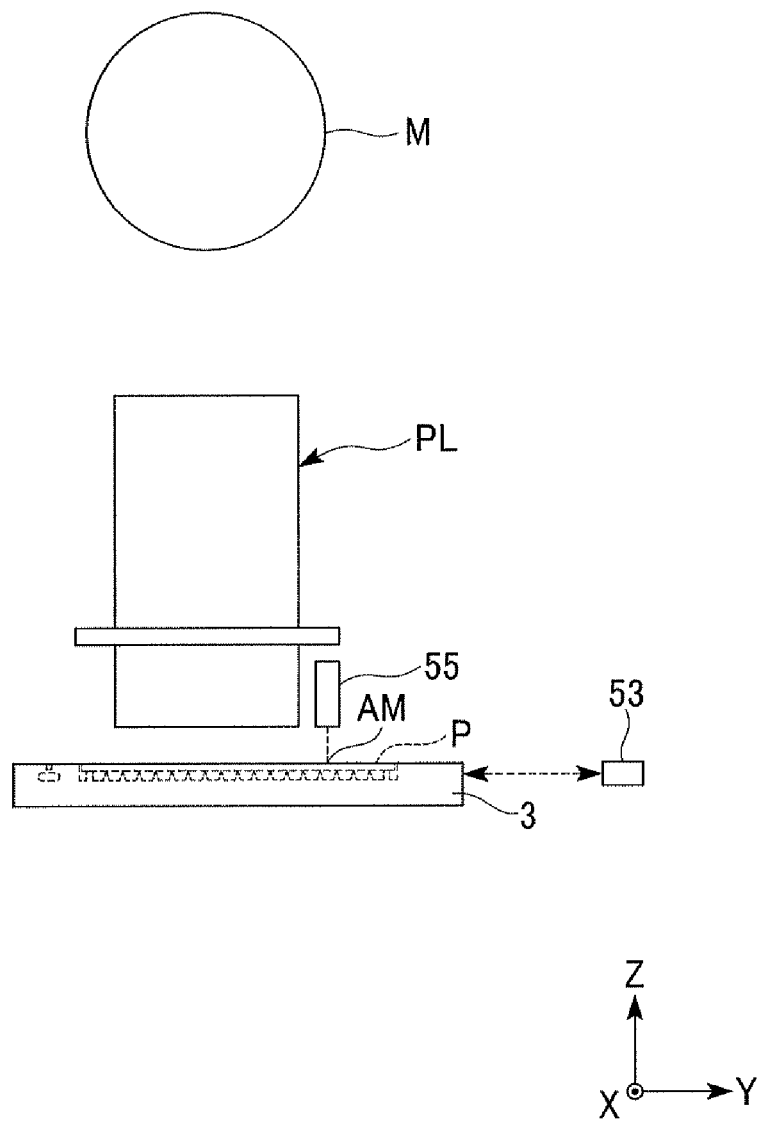
FIG. 16 is a typical view in order to illustrate an example of an operation of an exposure apparatus according to the first embodiment.

The control apparatus 6 is also able to detect a predetermined plurality of alignment marks AM which are provided on the substrate P using the alignment system 55, as shown in FIG. 16, while measuring the position information in the X axial direction and the Y axial direction of the substrate holding member 3 which is holding the substrate P using the laser interferometer system 53 (step SA3).

As a result, the control apparatus 6 is able to determine position information in the X axial direction and the Y axial direction for each of the alignment marks AM within a coordinate system which is prescribed by the laser interferometer system 53.

Based on the position information of the respective alignment marks AM on the substrate P determined in step SA3, the control apparatus 6 determines position information for each one of the plurality of shot areas S1 through S26 on the substrate P relative to detection reference positions of the alignment system 55 using calculation processing (step SA4). When the respective position information for the plurality of shot areas S1 through S26 on the substrate P is being determined by calculation processing, then what is known as an EGA (enhanced global alignment) method such as that disclosed in, for example, Japanese Patent Application Publication No. S61-44429 A is used.

As a result, using the alignment system 55, the control apparatus 6 is able to detect the alignment marks AM on the substrate P, and is able to decide positional coordinates (i.e., array coordinates) for each one of the plurality of shot areas S1 through S26 which are provided on the substrate P within an XY coordinate system prescribed by the laser interferometer system 53. Namely, the control apparatus 6 is able to ascertain where each of the shot areas S1 through S26 is positioned on the substrate P relative to a detection reference position of the alignment system 55 within an XY coordinate system prescribed by the laser interferometer system 53.

The control apparatus 6 detects the position information for the mask M held on the mask holding member 1 using the encoder system 51, and detects an image (i.e., a projection image, a spatial image) of the alignment marks RM provided on the mask M using the light receiving device 56 provided on the substrate holding member 3 (step SA5) while measuring position information for the substrate holding member 3 which is holding the substrate P using the laser interferometer system 53.

Figure 17:
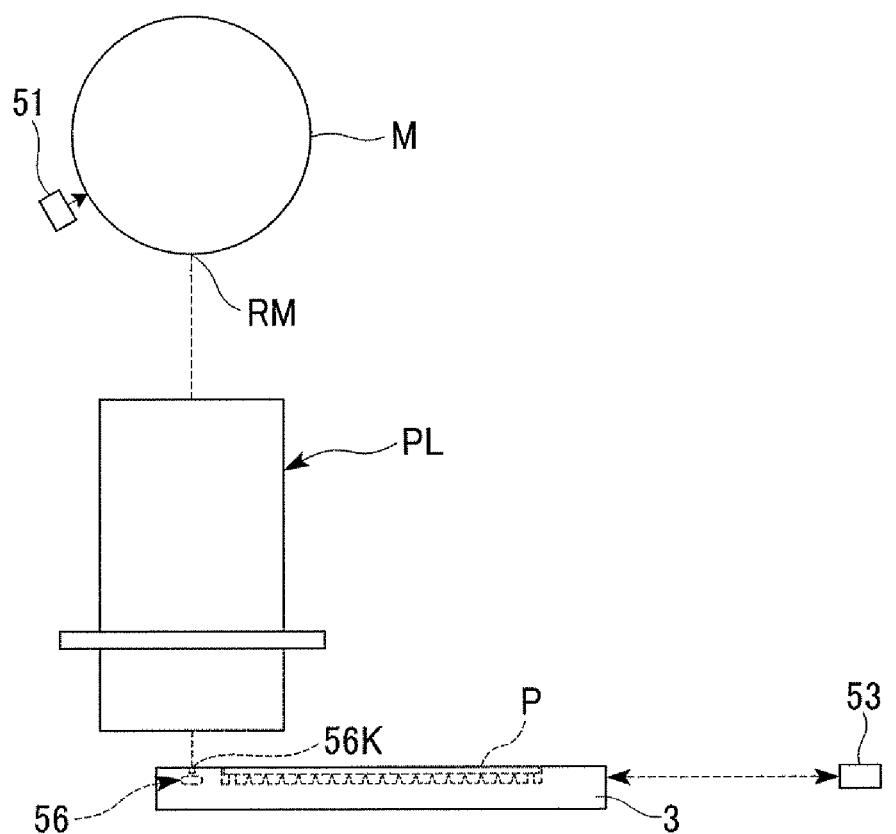
FIG. 17 is a typical view in order to illustrate an example of an operation of an exposure apparatus according to the first embodiment.

Namely, as is shown in FIG. 17, when the control apparatus 6 has made the projection optical system Pt face the aperture 56K in the substrate holding member 3, the alignment marks RM provided on the mask M are illuminated by the exposure light EL. As a result, a spatial image of the alignment marks provided on the mask M is projected onto the top surface 3F of the substrate holding member 3 which includes the aperture 56K via the projection optical system PL, and the light receiving device 56 provided on the substrate holding member 3 is able to detect the spatial image of the alignment marks RM provided on the mask M.

Accordingly, the control apparatus 6 is able to determine the position in the X axial direction and the Y axial direction of a spatial image (i.e., a projection image) within a coordinate system prescribed by the laser interferometer system 53 using the light receiving device 56 (i.e., the aperture 56K) provided on the substrate holding member 3.

Moreover, the position information for the mask M when the spatial image of the alignment marks RM is being measured by the light receiving device 56 is detected by the encoder system 51. By detecting the position detection marks EM (i.e., the first marks EM), the encoder system 51 detects the position information for the alignment marks RM, and consequently the position information for the patterns MP, taking a reference mark (i.e., a rotation start position mark) RMS as a reference. Namely, the control apparatus 6 is able to ascertain where the respective patterns MP on the mask M are positioned relative to the reference mark (i.e., the rotation start position mark) RMS based on detection results from the encoder system 51.

The patterns MP on the mask M and the alignment marks RM are formed in a predetermined positional relationship, and the positional relationship between the reference mark FM on the substrate holding member 3 and the aperture 56K (i.e., the light receiving device 56) is also known. In addition the detection values from the encoder system 51 of the detection system 5 are associated with the detection values of the laser interferometer system 53. Accordingly, based on detection results from step SA5, the control apparatus 6 is able to derive a relationship between a predetermined reference position within a coordinate system prescribed by the laser interferometer system 53 and projected positions of images of the patterns MP on the mask M (step SA6).

The control apparatus 6 derives relationships between projected positions of images of the patterns MP on the mask M within a coordinate system prescribed by the laser interferometer system 53 and the respective shot areas S1 through S26 on the substrate P based on the positional relationship between the predetermined reference position within a coordinate system prescribed by the laser interferometer system 53 and the respective shot areas S1 through S26 on the substrate P (i.e., array information for the shot areas S1 through S26 relative to the predetermined reference position) determined in step SA4, and based on the relationship between the predetermined reference position within a coordinate system prescribed by the laser interferometer system 53 and the projected positions of the images on the patterns MP on the mask M determined in step SA6.

In this manner, in the present embodiment, the control apparatus 6 detects light via the alignment marks RM on the mask M using the light receiving device 56, and is able to acquire information relating to the positional relationships between the images of the patterns MP on the mask M and the shot areas S1 through S26 on the substrate P.

In order to start the exposure of the substrate P, the control apparatus 6 moves the substrate P which is being held on the substrate holding member 3 to the initial exposure start position using the substrate driving apparatus 4 while measuring the position information of the substrate holding member 3 which is holding the substrate P (and consequently the position information of the shot areas S on the substrate P) using the laser interferometer system 53. In the present embodiment, the control apparatus 6 moves the substrate P which is being held on the substrate holding member 3 such that, of the plurality of shot areas S1 through S26, the first shot area S1 is placed in the vicinity of the −Y side of the projection area AR.

Moreover, in order to start the exposure of the substrate P, the control apparatus 6 moves the mask M which is being held on the mask holding member 1 to the exposure start position (i.e., the rotation start position) using the mask driving apparatus 2 while measuring the position information of the mask M which is being held on the mask holding member 1 (and consequently the position information of the patterns MP on the mask M) using the encoder system 51. The control apparatus 6 moves (i.e., rotates) the mask M to the rotation start position when the mask M is to be rotated in synchronization with the movement of the substrate P by detecting detection light which has transited the rotation start position mark EMS using the fifth encoder 51S of the first detection system 5A. In the present embodiment, the control apparatus 6 moves the mask M which is being held on the mask holding member 1 such that, of the plurality of (six) pattern formation areas MA, the first pattern formation area MA is placed in the vicinity of the +Y side of the illumination area IA (step SA8).

Moreover, based on detection results from the focus and leveling detection system 54, the control apparatus 6 makes adjustments such that the surface (i.e., the exposure surface) of the substrate P is placed in a predetermined positional relationship with the image plane of the projection optical system PL.

Based on detection results from the focus and leveling detection system 52, the control apparatus 6 also makes adjustments such that the bottommost portion BT of the mask M is placed in a predetermined positional relationship with the substance surface of the projection optical system PL. The bottommost portion BT of the mask M is placed in an optically conjugate position with the surface of the substrate P as seen from the projection optical system PL.

The control apparatus 6 controls the substrate driving apparatus 4 so as to start the movement of the substrate P in the +Y direction, and controls the mask drive substrate 2 so as to start the movement (i.e., the rotation) of the mask M in the −θX direction.

When the speed of the movement of the substrate P in the +Y direction and the speed of the rotation (i.e., the angular velocity) of the mask M in the −θX direction are respectively uniform, and the end portion on the +Y side of the first shot area S1 reaches the projection area AR, the control apparatus 6 irradiates the exposure light EL from the illumination system IL. At the same time as the control apparatus 6 is moving the substrate P in the +Y direction in synchronization with the movement (i.e., the rotation) of the mask M in the −θX direction using the mask driving apparatus 2 and the substrate driving apparatus 4 respectively, it also illuminates the patterns MP on the mask M using the exposure light EL and thereby projects images of the patterns MP on the mask M onto the substrate P via the projection optical system PL. The control apparatus 6 illuminates the patterns MP on the mask M using the exposure light EL while rotating the mask M with the center axis J taken as the axis of rotation.

During scan exposure, when an image of a pattern MP on a portion of the mask M is being projected onto the projection area AR, the substrate P is moved in the +Y direction at the speed $\beta \cdot V$ (wherein $\beta$ is the projection ratio) in synchronization with the pattern MP at the bottommost portion BT of the mask M moving substantially in the −Y direction at the speed V in the projection optical system PL.

A plurality of the patterns MP are formed extending in the circumferential direction on the pattern formation surface MF of the mask M. The control apparatus 6 moves the shot areas S on the substrate P in the Y axial direction relative to the projection area AR of the projection optical system PL, and also exposes the shot area S on the substrate P using the image of the pattern MP which is formed in the projection area AR by irradiating the exposure light EL thereon while at the same time moving (i.e., rotating) the pattern formation surface MF of the mask M in the θX direction relative to the illumination area IA of the illumination system IL in synchronization with the movement of the substrate P in the Y axial direction. The images of the plurality of patterns MP on the mask M are formed sequentially on the substrate P as a result of the patterns MP on the mask M being illuminated by the exposure light EL while the mask M is rotated in synchronization with the movement of the substrate P in the Y axial direction with the center axis J taken as the axis of rotation (step SA9).

The control apparatus 6 monitors the position information of the mask M (i.e., of the patterns MP) using the first detection system 5A of the detection system 5, and exposes the substrate P using the images of the patterns MP on the mask M by driving the mask M and the substrate P while monitoring the position information of the substrate P (i.e., of the shot areas S) using the second detection system 5B. Namely, based on detection results from the detection system 5, the control apparatus 6 controls the mask driving apparatus 2 and the substrate driving apparatus 4, and controls the driving of the mask M and the substrate P when the images of the patterns MP on the mask M are being formed on the substrate P.

Specifically, while the mask M is being rotated, the first detection system 5A projects detection light onto the mark formation area MB of the mask M using the respective light projection devices 501 of the respective encoders 51A through 51D of the encoder system 51, and detects the detection light which has passed through the mark formation area MB of this mask M using the respective light receiving devices 502. Moreover, while the mask M is being rotated, the first detection system 5A projects detection light onto the pattern formation areas MA of the mask M from the light projection device 52A of the focus and leveling detection system 52, and detects the detection light which has passed through the pattern formation areas MA of the mask M using the light receiving device 52B. Namely, when the mask M is being rotated, the first detection system 5A detects the detection light which has passed through the mask M, and based on these detection results, acquires position information relating to the directions of the six degrees of freedom for the patterns MP on the mask M.

In addition, when the substrate P is being moved, the second detection system 5B projects detection light onto the measuring mirrors of the substrate holding member 3 which is holding the substrate P using the laser interferometer system 53, and detects the detection light which has transited these measurement mirrors. When the substrate P is being moved, the second detection system 5 also projects detection light onto the surface of the substrate P using the light projection device 54A of the focus and leveling detection system 54, and detects the detection light which has transited the surface of the substrate P using the light receiving device 54B. Namely, when the substrate P is being moved, the second detection system 5B detects the detection light which has transited the substrate P, and based on these detection results, acquires position information relating to the directions of the six degrees of freedom for the shot areas S on the substrate P.

Based on the position information relating to the six degrees of freedom of the patterns MP on the mask M including the circumferential direction (i.e., the θX direction) of the pattern formation surface MF which were required using the first detection system 5A, the control apparatus 6 controls the driving in the directions of the six degrees of freedom including around the center axis J (i.e., the θX direction) for the mask M when the images on the patterns MP on the mask M are being formed on the substrate P.

In addition, the control apparatus 6 controls the driving in the directions of the six degrees of freedom of the substrate P when the patterns MP on the mask M are being formed on the substrate P based on position information relating to the six degrees of freedom of the shot areas S on the substrate P which were acquired using the second detection system 5B.

In this manner, based on position information relating to the directions of the six degrees of freedom of the mask M and the substrate P which were acquired using the detection system 5, the control apparatus 6 irradiates the exposure light EL onto the substrate P through the mask M while adjusting the positions in the directions of the six degrees of freedom of the mask M and the substrate P (i.e., while adjusting the relative positional relationship between the mask M and the substrate P).

In the present embodiment, because six patterns MP are formed in the circumferential direction of the pattern formation surface MF on the mask M, when the mask M has rotated by substantially 60°, the exposure of the first shot area S1 is ended.

When the scan exposure has ended for the first shot area S1 which is to be exposed first, the control apparatus 6 continues the rotation of the mask M in the −θX direction and also continues the movement of the substrate P in the +Y direction without reducing the speed of either the mask holding member 1 which is holding the mask M or the substrate holding member 3 which is holding the substrate P. The control apparatus 6 performs the exposure of the second shot area S2 which is located on the −Y side of the first shot area S1 in the same way as the exposure of the first shot area S1 was performed.

The control apparatus 6 continues the rotation of the mask M in the −θX direction and also continues the movement of the substrate P in the +Y direction without reducing the speed of either the mask holding member 1 which is holding the mask M or the substrate holding member 3 which is holding the substrate P, and thus consecutively exposes the third shot area S3 and the fourth shot area S4. In this manner, in the present embodiment, in a single scan, the control apparatus 6 continuously exposes the shot areas S1 through S4 of a single row aligned in the Y axial direction.

When the exposure of the fourth shot area S4 has ended, the control apparatus 6 slows down the substrate holding member 3. The control apparatus 6 determines whether or not the exposure of a single substrate P has ended, namely, determines whether or not all of the substrate P has been exposed (step SA10). Here, only the exposure of the first through fourth shot areas S1 through S4 has ended, and the remaining shot areas are still to be exposed.

In step SA10, if it is determined that the entire exposure of the substrate P has not yet been completed, the control apparatus 6 moves the substrate P which is being held on the substrate holding member 3 to the next exposure start position using the substrate driving apparatus 4, while measuring the position information of the substrate holding member 3 (and consequently the position information of the shot areas S on the substrate P) which is holding the substrate P using the laser interferometer system 53. In the present embodiment, the control apparatus 6 moves the substrate P which is being held on the substrate holding member 3 such that, of the plurality of shot areas S1 through S26, the fifth shot area S5 is placed in the vicinity of the +Y side of the projection area AR.

Moreover, in order to start the exposure of the substrate P, the control apparatus 6 moves the mask M which is being held on the mask holding member 1 to the exposure start position (i.e., to the rotation start position) using the mask driving apparatus 2, while measuring the position information of the mask M (and consequently the position information of the patterns MP on the mask M) which is being held on the mask holding member 1 using the encoder system 51. The control apparatus 6 detects the detection light which has transited the rotation start position mark EMS using the fifth encoder 51S of the first detection system 5A, and moves (i.e., rotates) the mask M to the rotation start position when the mask M is being rotated in synchronization with the movement of the substrate P. In the present embodiment, the control apparatus 6 moves the mask M which is being held on the mask holding member 1 such that, of the plurality of (i.e. six) pattern formation areas MA, the first pattern formation area MA is placed in the vicinity of the −Y side of the illumination area IA (step SA11).

In the present embodiment, the control apparatus 6 performs the movement of the mask M to the rotation start position in parallel with at least a portion of the movement of the substrate P to the exposure start position. Moreover, the control apparatus 6 stops the irradiation of the exposure light EL onto the mask M (i.e., temporarily stops the exposure of the substrate P) while the mask M is being moved to the rotation start position.

Moreover, here, in order to expose the first through fourth shot areas S1 through S4, the mask M is rotated in the −θX direction, and, after the exposure of the fourth shot area S4 has ended, the rotation in the same direction as the direction followed during the exposure of the first through fourth shot areas S1 through S4, namely, the rotation in the −θX direction is continued, resulting in the rotation start position being more quickly reached compared with when the rotation is in the opposite direction, namely, in the +θX direction.

When the movement of both the mask M and the substrate P to their exposure start positions is complete, the control apparatus 6 sets the direction of movement (i.e., the direction of rotation) of the mask holding member 1 which is holding the mask M to the reverse direction, and sets the direction of movement of the substrate holding member 3 which is holding the substrate P to the reverse direction (step SA12).

The control apparatus 6 controls the substrate driving apparatus 4 so that the movement of the substrate P in the −Y direction is started, and controls the mask driving apparatus 2 so that the movement (i.e., the rotation) of the mask M in the +θX direction is started.

When the speed of the movement of the substrate P in the −Y direction and the speed of the rotation of the mask M in the +θX direction are respectively uniform, and the end portion on the −Y side of the fifth shot area S5 reaches the projection area AR, the control apparatus 6 irradiates the exposure light EL from the illumination system IL. At the same time as the control apparatus 6 is moving the substrate P in the −Y direction in synchronization with the movement (i.e., the rotation) of the mask M in the +θX direction, it also illuminates the patterns MP on the mask M using the exposure light EL and thereby projects images of the patterns MP on the mask M onto the substrate P via the projection optical system PL. The control apparatus 6 illuminates the patterns MP on the mask M using the exposure light EL while rotating the mask M with the center axis J taken as the axis of rotation. By illuminating the patterns MP on the mask M using the exposure light EL while rotating the mask M with the center axis J taken as the axis of rotation in synchronization with the movement of the substrate P in the Y axial direction, the images of the plurality of patterns MP on the mask M are sequentially formed on the substrate P (step SA9).

In this case as well, based on position information relating to the directions of the six degrees of freedom of the mask M and the substrate P which were acquired using the detection system 5, the control apparatus 6 irradiates the exposure light EL onto the substrate P through the mask M while adjusting the positions in the directions of the six degrees of freedom of the mask M and the substrate P (i.e., while adjusting the relative positional relationship between the mask M and the substrate P).

When the scan exposure has ended for the fifth shot area S5, the control apparatus 6 continues the rotation of the mask M in the +θX direction and also continues the movement of the substrate P in the −Y direction without reducing the speed of either the mask holding member 1 which is holding the mask M or the substrate holding member 3 which is holding the substrate P. The control apparatus 6 performs the exposure of the sixth shot area S6 which is located on the +Y side of the fifth shot area S5 in the same way as the exposure of the fifth shot area S5 was performed.

The control apparatus 6 continues the rotation of the mask M in the +θX direction and also continues the movement of the substrate P in the −Y direction without reducing the speed of either the mask holding member 1 which is holding the mask M or the substrate holding member 3 which is holding the substrate P, and thus consecutively exposes the seventh, eighth, ninth, and tenth shot areas S7, S8, S9, and S10. In this manner, in the present embodiment, in a single scan, the control apparatus 6 continuously exposes the shot areas S5 through S10 of a single row aligned in the Y axial direction.

As has been described above, in the present embodiment, the same number of patterns MP of the mask M are formed extending in the circumferential direction on the pattern formation surface MF as the maximum number (six in the present embodiment) of shot areas S in at least the scan direction (i.e., in the Y axial direction) of the substrate P. Accordingly, the control apparatus 6 is able to execute the exposure of the single row of shot areas S5 through S10 which are aligned in the Y axial direction by rotating the mask M 360° (i.e., completing a single rotation).

Thereafter, in the same way, each time the control apparatus 6 completes the exposure of a single row of the shot areas S which are aligned in the Y axial direction (i.e., S11 through S16, S17 through S22, and S23 through S26), the direction of rotation of the mask M is set to the reverse direction (i.e., is inverted), and the direction of movement of the substrate P is set to the reverse direction, so that the exposure processing is executed in row units (step SA9 through SA12).

As a result of the above described operation being repeated so that, in step SA10, it is determined that all of the substrate P has been exposed, the control apparatus 6 unloads the substrate P which is being held on the substrate holding member 3 (step SA13). Next, the control apparatus 6 determines whether or not another substrate P which requires exposure is present (step SA14). If it is determined in step SA14 that another substrate P requiring exposure is present, the control apparatus 6 repeats the processing of step SA1 and the steps subsequent thereto. If, on the other hand, it is determined in step SA14 that no substrate P requiring exposure is present, the control apparatus 6 ends the exposure sequence.

As has been described above, in the present embodiment, because a mask M is formed such that the conditions of Formula (1) described above are satisfied, it is possible to suppress any reduction in throughput and form superior images of the patterns MP on the substrate P.

Namely, if, for example, the diameter D of the mask M is extremely small, and the length in the circumferential direction of the mask M (π×D) is considerably smaller compared to the maximum length L of the substrate P, then in order to expose the plurality of shot areas S on the substrate P, there is a possibility that it will be necessary, for example, to rotate the mask M a plurality of times, or to frequently change the rotation direction of the mask M.

For example, if the length in the circumferential direction of the mask M (π×D) is small, so that only one pattern MP can be formed in the circumferential direction on the pattern formation surface MF, then in order, for example, to expose the shot areas S5 through S10, it is necessary to rotate the mask M six times. If only one pattern MP is formed in the circumferential direction on the pattern formation surface MF, then the possibility may arise that, in order, for example, to expose the fifth, sixteenth, and seventeenth shot areas S5, S16, and S17 in that sequence, the mask M must be firstly rotated in the +θX direction in order to expose the fifth shot area S5. Next, in order to expose the sixteenth shot area S16, the mask M must be rotated in the −θX direction, and, finally, in order to expose the seventeenth shot area S17, the mask M must be rotated in the +θX direction.

If the mask M is rotated a plurality of times, or if the direction of movement of the mask and/or the direction of movement of the substrate are frequently changed, there is a possibility that vibrations will occur and that there will be a deterioration in the exposure accuracy. In order to accurately expose the substrate P while moving the substrate P in synchronization with the movement of the mask M, after the acceleration of the mask and/or substrate has ended, it is necessary to get the generated vibration under control and secure a sufficiently long wait time (i.e., a static time) for the speed to become constant. In this case, there is an increase in the length of time which is not used for exposure, and there is a possibility that a deterioration in throughput will occur.

Moreover, the size of the shot areas S varies in accordance with the size of the device being manufactured, however, in cases in which, for example, the diameter D of the mask M is extremely small, and the length in the circumferential direction of the mask M ($\pi \times D$) is extremely small compared to the maximum Length L of the substrate P, then there are limits on the size of the pattern MP (i.e., the size in the circumferential direction) which can be formed on the mask M, and there is a possibility that, for example, it will not be possible to properly form shot areas S having a predetermined size in the X axial direction. Moreover, in cases in which the rotation direction of the mask M is prevented from being frequently changed in order to suppress vibration and the like, or in cases when the shot areas S are exposed while the mask M is being rotated as much as possible at a constant velocity, if the length in the circumferential direction of the mask M ($\pi \times D$) is small and there are restrictions on the size and placement of the pattern MP in the circumferential direction of the mask M, then restrictions become imposed on the placement of the shot areas S on the substrate P, and there is a possibility that defects will occur that increase the number of wasted areas on the substrate P such as, for example, the gap between adjacent shot areas S in the Y axial direction on the substrate P being increased, or the number of shot areas that can be formed being reduced.

In contrast, altering the size (i.e., the diameter D) of the mask M in accordance with the device being manufactured (i.e., in accordance with the size of the shot areas S) means that the processing to maintain exposure accuracy becomes more complex, and may lead to a likelihood that manufacturing costs will rise due to the fact that it becomes necessary to manufacture a plurality of different sized masks M. For example, if the diameter D of the mask M is changed without the position of the axis of rotation (i.e., the center axis J) of the mask M being changed, then because there is a change in the positional relationship between the projection optical system PL and the mask M, specifically, a change in the positional relationship between the substance surface of the projection optical system PL and the bottommost portion BT of the mask M where the exposure light EL is irradiated, each time the size of the mask M changes, the possibility arises that it will become necessary to alter the optical characteristics of the projection optical system PL. Moreover, by altering the size (i.e., the diameter D) of the mask M, and changing the position of the axis of rotation (i.e., the center axis J) of the mask M, even if the positional relationship between the substance surface of the projection optical system PL and the bottommost portion BT of the mask M where the exposure light EL is irradiated is maintained, because the curvature of the mask M changes, in this case as well, the possibility arises that it will become necessary to correct the optical characteristics of the projection optical system PL.

In the present embodiment, because the mask M is formed so as to satisfy the conditions of Formula (1), it is possible to suppress the occurrence of the above described malfunctions, and control any deterioration in throughput, and form superior images of the patterns MP on a substrate P. Namely, simply by rotating the mask M once (i.e., rotating it 360°), it is possible to smoothly expose a plurality of (i.e., six shot areas which are aligned in the portion of the maximum length L of the substrate P. Moreover, even if the shot areas which are aligned in portions other than the portion of the maximum length L of the substrate P (for example, the first through fourth shot areas S1 through S4) are to be exposed, then the mask M does not even need to complete a full rotation, and simply by being rotated approximately 240°, it is possible to suppress the occurrence of vibration or the like, and smoothly expose the first through fourth shot areas S1 through S4. After the fourth shot area S4 has been exposed, as is described above, it is possible to limit any reduction in throughput by executing the movement of the mask M to the rotation start position in parallel with at least a portion of the movement of the substrate P to the exposure start position.

Furthermore, by forming the mask M so as to satisfy the conditions of Formula (1), it is possible to increase the radius of curvature of the mask M and decrease the curvature of the patterns MP. Moreover, by forming the mask M so as to satisfy the conditions of Formula (1), it is possible to it is possible to increase the moment of inertia of the mask M, and to thereby stabilize the rotation of the mask M.

In addition, because a plurality of the patterns MP are formed on the pattern formation surface MF of the mask M, it is possible to form the images of the plurality of patterns MP on the substrate P in a single scan operation while limiting the number of changes (i.e., switches) in the direction of movement of the mask M, and while also limiting the number of changes (i.e., of switches) in the direction of movement of the substrate P which accompany the changes in the direction of movement of the mask M.

Furthermore, because the same number of patterns MP are formed extending in the circumferential direction on the pattern formation surface MF of the mask M as the maximum number of shot areas S which are formed in the Y axial direction on the substrate P, it is possible to execute the exposure of a single row of shot areas S which are aligned in the Y axial direction simply by rotating the mask M once.

Moreover, in the present embodiment, because the mask holding member 1 holds the side surface MS of the mask M such that the mask M can be replaced, it is possible to smoothly replace a mask M without this leading to any reduction in throughput, for example.

In addition, because the mask holding member 1 is placed on one end side (i.e., on the +X side) of the shaft member 20 which rotatably supports this mask holding member 1, it is possible to smoothly load a mask M onto the mask holding member 1 from this one end side of the shaft member 20, and it is possible to smoothly unload a mask M which is being held on the mask holding member 1 from this one end side of the shaft member 20.

Moreover, in the present embodiment, because the mask driving apparatus 2 is provided which is able to move the mask holding member 1 which is holding a mask M in the directions of the six degrees of freedom, it is possible to adjust the position of the mask M, and to accurately adjust the positional relationship between the mask M and the substrate P, and to expose a superior image of a pattern MP on the mask M onto the substrate P.

Moreover, in the present embodiment, the anti vibration apparatus 24 is provided which includes the countermass 46 which suppresses vibration caused by the movement (i.e., the rotation of the mask holding member 1 which is holding the mask M. Accordingly, it is possible to suppress any variation in the positional relationship between the mask M and the substrate P which is caused by this vibration, and it is this possible to suppress any deterioration in exposure accuracy which is caused by this vibration.

Moreover, in the present embodiment, the mask holding member 1 which is holding the mask M is located on the one end side (i.e., on the +X side) of the shaft member 20, and the weight member 22 is placed on the other end side (i.e., on the −X side) of this shaft member 20. The support member 21 which rotatably supports the shaft member 20 is placed between the mask holding member 1 and the weight member 22. The weight member 22 functions as what is known as a balance weight, and prevents a load being applied to one end side only of the shaft member 20. Accordingly, it is possible to prevent any variation in the second gap G2, the third gap G3, and the fourth gap G4 which is due to an unbalanced load, and restrict contact between the shaft member 20 and the support member 21. Accordingly, the shaft member 20 can be made to rotate smoothly while the occurrence of vibration is suppressed.

Moreover, in the present embodiment, the shaft member 20 and the weight member 22 are formed as a single unit, however, it is also possible to provide a holding mechanism which removably holds the weight member 22 at the other end side of the shaft member 20, so that the weight member 22 can be replaced. Because the weight member 22 functions as a balance weight, a plurality of weight members 22 having respectively different weights can be prepared, and a weight member 22 of a suitable weight can be mounted on the other end side of the shaft member 20 to correspond to the size (i.e., to the weight) of the mask M which is being used. Alternatively, the weight member 22 can be omitted according to the weight of the mask M.

Second Embodiment

Next, a second embodiment will be described. In the description given below, member elements that are identical or equivalent to those in the above described embodiment are given the same symbols and any description thereof is either simplified or omitted.

In the above described first embodiment, the mask M is formed so as to satisfy the conditions of Formula (1), however, if the diameter of the mask M on the pattern formation surface MF is taken as D, if the maximum length of the substrate P in the scanning direction of the substrate P (i.e., the Y axial direction in the present embodiment) is taken as L, if the projection ratio of the projection optical system PL is taken as β, and if the circumference ratio is taken as π, then it is also possible to form the mask M such that the conditions for the following formula are satisfied.

$$(\beta \times L)/\pi \geq D \geq (\beta \times L)/(2 \times \pi) \quad (2)$$

For example, if the mask M is formed such that the conditions for the above-described Formula (1) are satisfied, and the size of the mask M is increased, then by forming the mask M such that the conditions for the above-described Formula (2) are satisfied, it is possible to both limit any reduction in throughput, and also suppress any deterioration in exposure accuracy.

If the mask M is formed such that the conditions for Formula (2) are satisfied, then in order, for example, to expose the shot areas S in the portion of the maximum length L of the substrate P, there is a possibility that it will become necessary to rotate the mask M more than once (but not more than twice). However, by forming the mask M such that the conditions for the above-described Formula (2) are satisfied, it is possible to suppress any defects that might occur due to the increased size of the mask M, and limit any reduction in throughput, and also suppress any deterioration in exposure accuracy.

Furthermore, by satisfying the conditions for D≥(β×L)/(2×π), it is possible to suppress the occurrence of defects that are due to the small size of the mask M while maintaining the desired throughput. Namely, if the size of the mask M is reduced excessively, there is a possibility that it may not be possible to achieve the desired throughput, or that the radius of curvature of the mask M will become smaller so that the curvature of the patterns MP will increase, or that the moment of inertia of the mask M will become too small so that the rotation of the mask M becomes unstable. However, by satisfying the conditions for Formula (2), it is possible to suppress the occurrence of these problems.

Note that in each of the above described embodiments, a case in which the substrate P has a substantially circular shape within the XY plane is described as an example however, it is also possible for the substrate P to have a shape other than a circular shape such as, for example, a rectangular shape (i.e., an oblong shape) or the like. Even if the shape of the substrate P within an XY plane is a shape other than a circular shape, by still forming the mask M such that the conditions for Formula (1) or Formula (2) are satisfied based on the maximum length L of the substrate P in the scanning direction of the substrate P (i.e., in the Y axial direction), it is possible to suppress any reduction in throughput and form a superior image of the pattern on the substrate.

Note that in each of the above described embodiments, a reflective type of mask is used for the mask, however, it is also possible to use a transmission type of mask. In this case, the illumination system IL irradiates the exposure light EL, for example, on the topmost portion of the mask M. The exposure light EL which has passed through the mask M and passed through the bottommost portion BT of the mask M then enters the projection optical system PL.

Note also that in each of the above described embodiments, the mask M has a circular cylinder shape, however, it may also have a circular column shape. In this case, a portion of the protruding portion 28 and the shaft member 20 of the mask holding member 1 which protrude on the +X side from the holding surface 26 are omitted.

Note also that in each of the above described embodiments, a plurality of the patterns MP are formed in the circumferential direction on the pattern formation surface MF of the mask M, however, depending, for example, on the size of the device being manufactured (i.e., on the size of the shot areas S), it is not absolutely essential for a plurality of the patterns MP to be formed in the circumferential direction on the mask M. For example, even if there is only one pattern MP, by still forming the mask M such that the conditions for Formula (1) or Formula (2) are satisfied, it is possible to suppress any reduction in throughput and form a superior image of the pattern on the substrate P.

Note also that in each of the above described embodiments, it is also possible for a plurality of the patterns MP to be formed in the direction of the center axis J (i.e., in the X axial direction) of the mask M.

Note also that in each of the above described embodiments, it is also possible for an immersion method to be used such as that disclosed in, for example, PCT International Publication No. WO99/49504. Namely, in a state in which an optical path space for the exposure light EL between the projection optical system PL and the substrate P, in other words, an optical path space between the distal end of the projection optical system PL and the image plane (i.e., emission surface) side of the optical element is filled with a liquid, it is possible to irradiate the exposure light EL onto the substrate P via the mask M, the projection optical system PL, and the liquid, so that the images of the patterns MP on the mask M are formed on the substrate P. Moreover, if an immersion method is used, then it is also possible to employ a localized immersion system in which a liquid immersion area which is larger than the projection area AR but smaller than the substrate P is formed on a portion of the area on the substrate P so as to cover the projection area AR, as is disclosed in, for example, PCT International Publication No. W99/49504. Alternatively, it is also possible to employ a global immersion system in which exposure is performed with the entire surface of the substrate which is to be exposed being immersed in the liquid, as is disclosed in, for example, Japanese Patent Application Publication Nos. H06-124873 A and H10-303114 A, and in U.S. Pat. No. 5,825,043. The liquid that is used may be water (i.e., pure water), or may be a liquid other than water such as perfluoropolyether (PFPE), a fluorine-based fluid such as fluorine oil, cedar oil, and the like. Moreover, if an immersion method is used, then it is also possible for an optical path space on a substance surface (i.e., incident surface) side of a distal end optical element to be filled with a liquid as is disclosed in PCT International Publication No. WO2004/019128.

In an exposure apparatus which uses an immersion method, the optical element (i.e., the final optical element and the like) of the projection optical system PL may be formed, for example, from quartz (silica). Alternatively, the optical element may be formed from a mono-crystalline material such as a fluoride compound such as calcium fluoride (fluorite), barium fluoride, strontium fluoride, lithium fluoride, and sodium fluoride. Alternatively, the optical element may be formed from a material having a higher refractive index than that of quartz or fluorite (for example, 1.6 or more). Examples of materials having a refractive index of 1.6 or more include the sapphire and germanium dioxide disclosed in PCT International Publication No. WO2005/059617, or the potassium chloride (which has a refractive index of approximately 1.75) and the like disclosed in PCT International Publication No. WO 2005/059618. Furthermore, it is also possible to form a thin film having lyophilicity and/or a dissolution prevention function on a portion of (including at least the contact surface with the liquid) or on all of the surface of the optical element. Note that quartz has a high level of affinity with liquid and does not require a dissolution prevention film, however, it is possible to form at least a dissolution prevention film with fluorite. Liquids having a higher refractive index than that of pure water (for example, 1.5 or more) which can be used for the immersion include, for example, predetermined liquids having a C—H bond or an O—H bond such as isopropanol having a refractive index of approximately 1.50, glycerol (glycerin) having a refractive index of approximately 1.61, predetermined liquids (i.e., organic solvents) such as hexane, heptane, decane, and the like or decalin (i.e., decahydronaphthalene) having a refractive index of approximately 1.60. Moreover, the liquid may also be a mixture of any desired two or more liquids chosen from among these, or may be a mixture of pure water and at least one added (i.e., admixed) liquid chosen from among these. Furthermore, the liquid may also be obtained by adding (i.e., admixing) a salt or an acid such as $H^+$, $Cs^+$, $K^+$, $Cl^-$, $SO_4^{2-}$ or the like to pure water, or by adding (i.e., admixing) fine particles of aluminum oxide or the like to pure water. Note also that the immersion liquid is preferably one that has a low absorption coefficient of light, that has low temperature dependency, and that exhibits stability towards the photosensitive material (or the top coat film or anti-reflection film or the like) coated on the projection optical system and/or the surface of the substrate. It is possible to provide a top coat that protects the photosensitive material and the substrate from the liquid on the substrate.

Note also that in each of the above described embodiments, ArF excimer laser light is used for the exposure light EL, however, if a reflective mask is used for the mask M, then it is also possible to use soft X-rays (EUV) as the exposure light EL. The patterns MP of a reflective mask can be formed based on an EB rendering method using an EB exposure machine as is disclosed, for example, in Japanese Patent Application Publication No. H07-153672 A. A reflective mask can be formed by providing a multilayer film including Mo, Si, or the like on a base material such as quartz or ceramic or the like, and by then forming a pattern of an absorber which is able to absorb EUV and which includes Cr, W, Ta, or the like on this multilayer film.

Note also that the substrate P in each of the above described embodiments may be formed not only by a semiconductor wafer which is used for manufacturing semiconductor devices, but also by a glass substrate which is used for a display device, a ceramic wafer for a thin film magnetic head, or by the original plate (formed by synthetic quartz or a silicon wafer) of a mask or reticle which is used in an exposure apparatus, or by a film member or the like. In addition, the shape of the substrate is not limited to being a circular shape, and may be another shape such as a rectangle or the like.

The exposure apparatus EX may be a step-and-scan type of scanning exposure apparatus (i.e., a scanning stepper) which scan exposes a substrate P using images of patterns MP on a mask M while moving the substrate P in synchronization with the mask M. In addition to this, the present invention may also be used in a step-and-repeat type of projection exposure apparatus (i.e., a stepper) which moves a substrate P in sequential steps and collectively exposes the substrate P using the images on the patterns MP of the mask M with the mask M and the substrate P in a static state.

Furthermore, during a step-and-repeat exposure, when the first pattern and the substrate P are substantially stationary, it is also possible to first transfer a reduced image of the first pattern onto the substrate P using a projection optical system, and when the second pattern and the substrate P are substantially stationary, to then collectively expose a reduced image of the second pattern on the substrate P using the projection optical system such that it is partially superimposed over the first pattern (using a stitch type of collective exposure apparatus). This stitch type of exposure apparatus may be a step-and-stitch type of exposure apparatus which transfers at least two patterns onto a substrate P such that they partially overlap, and moves the substrate sequentially.

Moreover, the present invention may also be applied to a multi-stage type (i.e., a twin-stage type) of exposure apparatus which is provided with a plurality of substrate stages such as those disclosed in Japanese Patent Application Publication Nos. H10-163099 A, H10-214783 A (corresponding to U.S. Pat. Nos. 6,341,007, 6,400,441, 6,549,269, and 6,590,634), and Japanese Patent Application Publication No. 2000-505958 A (corresponding to U.S. Pat. No. 5,969,441).

Furthermore, the present invention can also be applied to an exposure apparatus which is provided with a substrate stage which holds a substrate, and with a measurement stage on which are mounted reference members on which reference marks are formed and/or various types of photoelectric sensor such as those disclosed in, for example, Japanese Patent Application Publication Nos. H11-135400 A (corresponding to PCT International Publication No. WO1999/23693) and 2000-164504 A (corresponding to U.S. Pat. No. 6,897,963).

The type of exposure apparatus which is used for the exposure apparatus EX is not limited to those which are used to manufacture semiconductor elements and which expose a semiconductor element pattern onto a substrate P, and a broad variety of exposure apparatuses and the like may be used including exposure apparatuses which are used to manufacture liquid crystal display elements or display units, and exposure apparatuses used to manufacture thin-film magnetic heads, image pickup devices (CCD), micromachines, MEMS, DNA chips, and reticles and masks, and the like.

Moreover, as is disclosed, for example, in Published Japanese Translation No. 2004-519850 of PCT International Publication (corresponding to U.S. Pat. No. 6,611,316), the present invention can also be applied to an exposure apparatus in which the patterns of two masks are synthesized on a substrate via a projection optical system, and that performs double exposures substantially simultaneously of a single shot area on a substrate in a single scan exposure operation.

As far as is permitted, the disclosures in all of the Patent Publications and U.S. Patents related to exposure apparatuses and the like cited in the above respective embodiments and modified examples, are incorporated herein by reference.

As has been described above, the exposure apparatus EX is manufactured by assembling various subsystems which include respective member elements such that they have a predetermined mechanical accuracy, electrical accuracy and optical accuracy. In order to secure these levels of accuracy, both before and after the assembly steps, adjustments to achieve optical accuracy in the various optical systems, adjustments to achieve mechanical accuracy in the various mechanical systems, and adjustments to achieve electrical accuracy in the various electrical systems are made. The assembly step to assemble an exposure apparatus from the various subsystems includes making mechanical connections, electrical circuit wiring connections, and air pressure circuit tube connections and the like between the various subsystems. Prior to the assembly step to assemble an exposure apparatus from the various subsystems, it is of course necessary to perform assembly steps to assemble the respective individual subsystems. Once the assembly step to assemble an exposure apparatus from the various subsystems has ended, comprehensive adjustments are made so as to secure various levels of accuracy in the exposure apparatus as a whole. Note that it is desirable for the manufacturing of the exposure apparatus to be conducted in a clean room in which temperature and cleanliness and the like are controlled.

Figure 18:
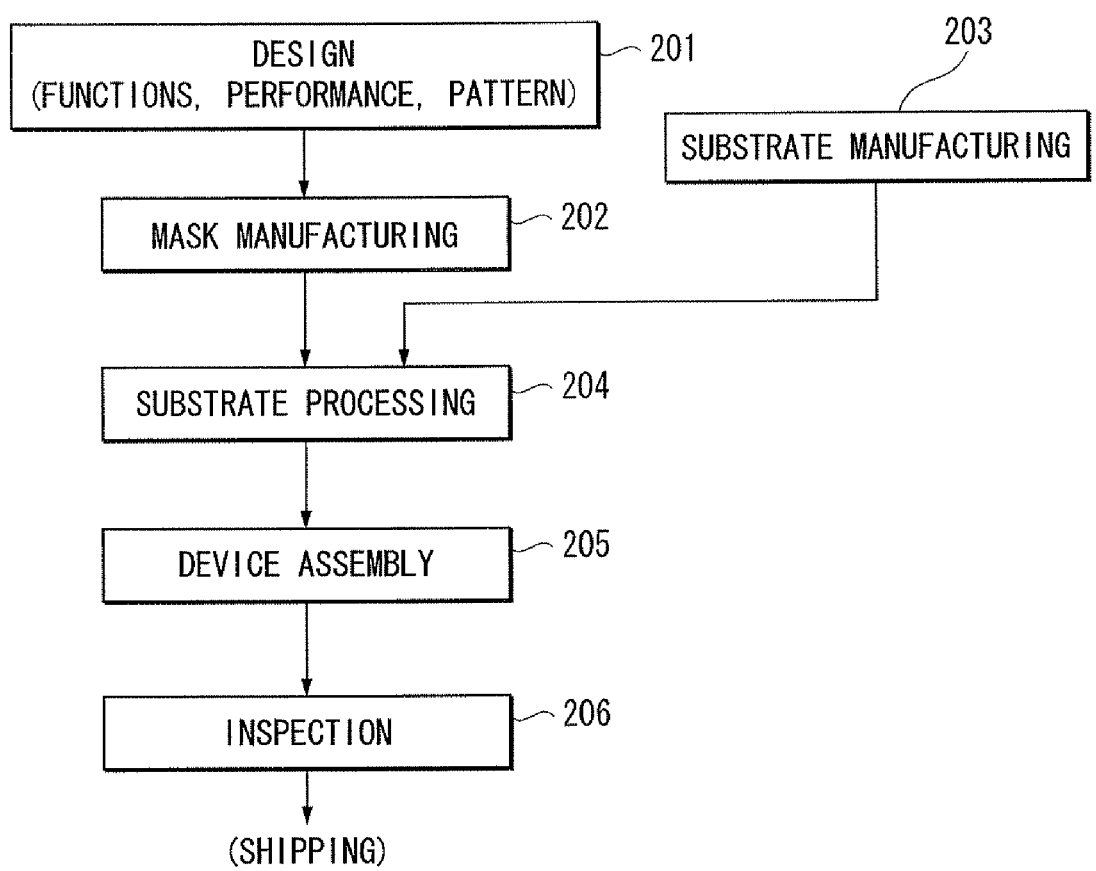
FIG. 18 is a flowchart showing an example of a process to manufacture a micro device.

As is shown in FIG. 18, a micro device such as a semiconductor device is manufactured via a step 201 in which the functions and performance of the micro device are designed, a step 202 in which a mask (i.e., a reticle) that is based on the design step is manufactured, a step 203 in which a substrate that forms the base material of the device is manufactured, a substrate processing step 204 that includes substrate processing (i.e., exposure processing) in which a substrate is exposed using an image of a pattern on the mask and the exposed substrate is then developed, a device assembly step 205 (including working processes such as a dicing step, a bonding step, a packaging step and the like), and an inspection step 206.

According to some aspects of the present invention, it is possible to suppress any deterioration in throughput and form a superior image of a pattern on a substrate. Accordingly, it is possible to manufacture a device which has a desired performance with a high level of productivity.

What is claimed is:

1. An exposure apparatus which exposes a projected image of a pattern onto a substrate moving in a predetermined direction, comprising:
a mask driving apparatus which rotates a cylinder-shaped mask about a predetermined rotation axis, wherein the cylinder-shaped mask includes:
a circular cylinder-shaped outer surface of a constant radius from the rotation axis,
a pattern formation area which is placed along the outer surface and arranged inward from both ends of the outer surface in a direction of the rotation axis,
a first scale area which is placed along the outer surface and arranged between the pattern formation area and one of the ends of the outer surface, an
a second scale area which is placed along the outer surface and arranged between the pattern formation area and the other of the ends of the outer surface;
a substrate driving apparatus which moves the substrate in the predetermined direction in synchronization with the rotation of the cylinder-shaped mask;
a position detecting apparatus which includes a first encoder system located to face with the first scale area for measuring a rotational position of the cylinder-shaped mask and a second encoder system located to face with the second scale area for measuring a rotational position of the cylinder-shaped; and
a controller that controls the mask driving apparatus based on detection results from the first and second encoder systems during rotation of the cylinder-shaped mask.

2. The exposure apparatus according to claim 1, further comprising:
a holding member which removably holds aside surface of the cylinder-shaped mask,
wherein the side surface is one of the ends of the outer surface and is perpendicular to the rotation axis, and the holding member has a surface perpendicular to the rotation axis that mates with the side surface of the cylinder-shaped mask and cooperates therewith to hold the cylinder-shaped mask on the holding member, and
wherein the mask driving apparatus comprises an actuator which rotates the holding member which is holding the cylinder-shaped mask.

3. The exposure apparatus according to claim 2, wherein the holding member has a suctioning mechanism which suctions the side surface of the cylinder-shaped mask.

4. The exposure apparatus according to claim 2, further comprising:
a shaft member which rotatably supports the holding member for rotation about the rotation axis,
wherein the holding member is placed on one end of the shaft member.

5. The exposure apparatus according to claim 2,
wherein the mask driving apparatus further comprises:
a first actuator that provides a rotational force to the holding member about the rotation axis,
a second actuator that provides a translational force to the holding member in the direction of the rotation axis, and
a third actuator that provides a translational force to the holding member in a direction perpendicular to the rotation axis and provides a rotational force to the holding member about an axis perpendicular to the rotation axis,
wherein the first, second, and third actuators are constructed to move the cylinder-shaped mask held by the holding member, in directions of six degrees of freedom.

6. The exposure apparatus according to claim 5, wherein each drive actuator is driven by means of Lorentz's force.

7. The exposure apparatus according to claim 5, further comprising:
a shaft member which rotatably supports the holding member which is holding the cylinder-shaped mask for rotation about the rotation axis,
wherein the first actuator rotates the holding member about the rotation axis with respect to the shaft member, and the third actuator is constructed to move the shaft member in a predetermined translational or rotational direction.

8. The exposure apparatus according to claim 7, wherein the first actuator has a rotor mounted on the holding member, and a stator mounted on the shaft member.

9. The exposure apparatus according to claim 5, further comprising:
an anti-vibration apparatus which suppresses vibration which is created by a movement of the holding member.

10. The exposure apparatus according to claim 9, wherein the anti-vibration apparatus comprises a countermass which absorbs reaction force created by a rotation of the holding member.

11. The exposure apparatus according to claim 10, wherein the countermass rotates in the opposite direction with respect to the holding member due to a reaction force which is created by a rotation of the cylinder-shaped mask.

12. The exposure apparatus according to claim 11, further comprising:
a holding mechanism which holds the countermass such that the countermass is displaceable by a predetermined amount.

13. The exposure apparatus according to claim 12, wherein the holding mechanism restricts any rotation of the countermass which is greater than a predetermined amount.

14. The exposure apparatus according to claim 12, wherein the holding mechanism comprises an actuator driven by means of Lorentz's force.

15. The exposure apparatus according to claim 14, wherein the position of the countermass is adjustable.

16. The exposure apparatus according to claim 11, further comprising:
a support member which rotatably supports the shaft member,
wherein the countermass comprises the shaft member.

17. The exposure apparatus according to claim 16, further comprising:
a weight member which is placed at one end of the shaft member,
wherein the holding member is placed at the other end of the shaft member, and
the support member is placed between the holding member and the weight member.

18. The exposure apparatus according to claim 1, further comprising:
a holding member which holds the cylinder-shaped mask;
wherein the mask driving apparatus comprises a plurality of drive actuators that provide translational force to the holding member along each of three mutually orthogonal axes and rotational force about each of the axes, one of which is the rotation axis, and
wherein the plurality of drive actuators are constructed to move the cylinder-shaped mask held by the holding member, in directions of six degrees of freedom.

19. The exposure apparatus according to claim 1, further comprising:
an illumination system which illuminates the cylinder-shaped mask with a rectangular-shaped illumination light elongated in the direction of the rotation axis,
wherein the illumination light is irradiated onto the pattern formation area of the cylinder-shaped mask rotated about the rotation axis, and a reflected light from the pattern formation area is irradiated onto the substrate moved by the substrate driving apparatus.

20. A device manufacturing method which uses the exposure apparatus according to claim 1.

21. The exposure apparatus according to claim 1, wherein the pattern formation area has a plurality of device patterns which are aligned in a circumferential direction on the outer surface of the cylinder-shaped mask.

22. The exposure apparatus according to claim 21,
wherein the substrate has a plurality of shot areas arranged in a one-dimensional direction corresponding to the direction in synchronization with the rotation of the cylinder-shaped mask, and
wherein each of the device patterns formed on the cylinder-shaped mask is exposed onto each of the shot areas respectively, during the rotation of the cylinder-shaped mask and the movement of the substrate.

23. The exposure apparatus according to claim 1, further comprising:
a projection optical system that projects an image of the pattern formed in the pattern formation area of the cylinder-shaped mask onto the substrate.

24. The exposure apparatus according to claim 1,
wherein the mask driving apparatus includes a plurality of actuators for rotational and translational movement of the cylinder-shaped mask, and
wherein the controller controls the plurality of actuators to adjust rotating position of the cylinder-shaped mask and to adjust translating position of the cylinder-shaped mask in the direction of the rotation axis.

25. The exposure apparatus according to claim 24, further comprising:
a holding member which removably holds the cylinder-shaped mask; and
a shaft member which rotatably supports the holding member so as to rotate about the rotation axis,
wherein, the holding member is placed on one end of the shaft member.

26. The exposure apparatus according to claim 1, wherein the first scale area and the second scale area are disposed around the whole outer surface in the circumferential direction.

27. The exposure apparatus according to claim 26, wherein each of the first and second scale areas includes a plurality of line patterns being arranged at a predetermined pitch in the circumferential direction of the outer surface of the cylinder-shaped mask.

28. The exposure apparatus according to claim 27, wherein each of the first and second scale areas includes a plurality of line patterns being arranged at a predetermined pitch in the direction of the rotation axis and formed along the circumferential direction of the outer surface of the cylinder-shaped mask.

29. The exposure apparatus according to claim 26, wherein the cylinder-shaped mask further includes a reference mark which indicates a start position in the circumferential direction of the outer surface of the pattern formation area.

30. An exposure method for exposing a projected image of a pattern onto a substrate moving in a predetermined direction, comprising:
(a) providing a cylinder-shaped mask which includes:
a circular cylinder-shaped outer surface of a constant radius from a predetermined rotation axis,
a pattern formation area which is placed along the outer surface and arranged inward from both ends of the outer surface in direction of the rotation axis,
a first scale area which is placed along the outer surface and arranged between the pattern formation area and one of the ends of the outer surface, and
a second scale area which is placed along the outer surface and arranged between the pattern formation area and the other of the ends of the outer surface;
(b) rotating the cylinder-shaped mask about the rotation axis by a mask driving apparatus;

(c) measuring at least rotational position of the cylinder-shaped mask by a first encoder system located to face with the first scale area and a second encoder system located to face with the second scale area;
(d) moving the substrate in the predetermined direction by a substrate driving apparatus;
(e) controlling the mask drive apparatus for synchronization between the cylinder-shaped mask and the substrate based on measurement results from the first and second encoder systems during rotation of the cylinder-shaped mask; and
(f) exposing the substrate to a projected image of the pattern.

\* \* \* \* \*